United States Patent
Hayashi et al.

(10) Patent No.: US 6,405,148 B1
(45) Date of Patent: Jun. 11, 2002

(54) AUTOMATIC SEMICONDUCTOR DEVICE CLASSIFICATION SYSTEM, METHOD FOR CLASSIFYING SEMICONDUCTOR DEVICE AND RECORDING MEDIUM HAVING PROGRAM FOR THE SYSTEM

(75) Inventors: Hideaki Hayashi; Yoshinobu Sawada; Toyohiko Takeda, all of Kanagawa-ken; Hironori Sonobe, Hyogo-ken, all of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/389,764

(22) Filed: Sep. 2, 1999

(30) Foreign Application Priority Data

Nov. 4, 1998  (JP) .......................................... 10-313585

(51) Int. Cl.⁷ .............................................. G01R 27/28
(52) U.S. Cl. ............... 702/117; 324/158 R; 324/158 D; 324/158.1; 395/24; 463/41; 716/4
(58) Field of Search .............................. 702/57, 64, 117, 702/71; 714/724, 733; 324/751

(56) References Cited

U.S. PATENT DOCUMENTS

| | | | | |
|---|---|---|---|---|
| 4,528,503 A | * | 7/1985 | Cole ....................... | 324/158 D |
| 5,097,204 A | * | 3/1992 | Yoshizawa et al. ..... | 324/158 R |
| 5,265,044 A | * | 11/1993 | Singh ......................... | 364/784 |
| 5,389,990 A | * | 2/1995 | Nakamura ............... | 324/158.1 |
| 5,553,195 A | * | 9/1996 | Meijer ......................... | 395/24 |
| 5,586,937 A | * | 12/1996 | Menashe .................... | 463/41 |
| 6,192,387 B1 | * | 2/2001 | Taddiken et al. ........... | 708/493 |
| 6,253,353 B1 | * | 6/2001 | Mahanpour et al. ........... | 716/4 |

FOREIGN PATENT DOCUMENTS

| | | |
|---|---|---|
| JP | 08068824 | 3/1996 |
| JP | 10206488 | 8/1998 |

* cited by examiner

Primary Examiner—John S. Hilten
Assistant Examiner—John Le
(74) Attorney, Agent, or Firm—Hogan & Hartson, L.L.P.

(57) ABSTRACT

The present invention discloses an automatic semiconductor device classification system including a current measuring unit, a data memory, a processor connected to the data memory and the current measuring unit, and an output unit connected to the processor. Patterns of curves representing approximate I-V characteristics between predetermined electrodes of semiconductor devices are automatically determined and the approximate I-V characteristics are classified into predetermined categories. The data memory stores the discrete I-V relations, and further stores a first control voltage, a first threshold current value at the first control voltage, a second control voltage corresponding to the second control voltage. The processor includes an acquisition circuit, a comparison circuit and a classification circuit. In the acquisition circuit, the first decision current value at the first control voltage and the second decision current value at the second control voltage are obtained using the measured results. In the comparison circuit, the first decision current value is compared with the first threshold current value stored in the data memory and the second decision current value is compared with the second threshold current value stored in the data memory. In the classification circuit, the patterns of the curves representing the approximate I-V characteristics are determined and classification is performed.

26 Claims, 19 Drawing Sheets

FIG.3

| INDEXES  | 0   | 1     | 2     | 3     | 4     | 5     | 6     | 7     | ------ | n     |
|----------|-----|-------|-------|-------|-------|-------|-------|-------|--------|-------|
| VOLTAGES | $v_0$ | $v_1$ | $v_2$ | $v_3$ | $v_4$ | $v_5$ | $v_6$ | $v_7$ | ------ | $v_n$ |
| CURRENTS | 0   | $i_1$ | $i_2$ | $i_3$ | $i_4$ | $i_5$ | $i_6$ | $i_7$ | ------ | $i_n$ |

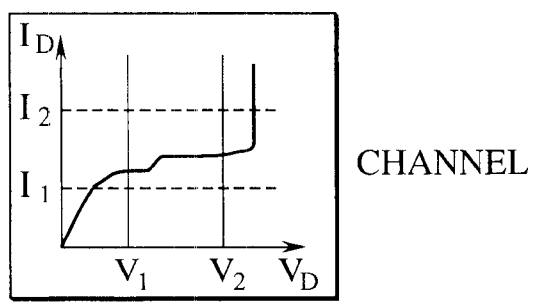
FIG.7A  CHANNEL
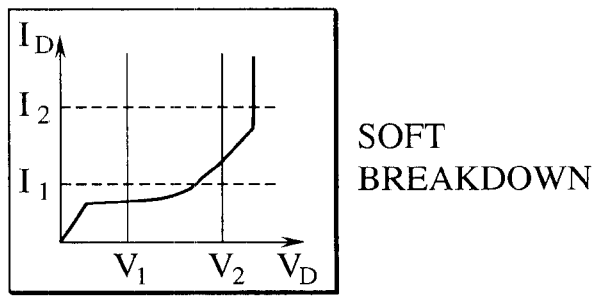
FIG.7B  SOFT BREAKDOWN
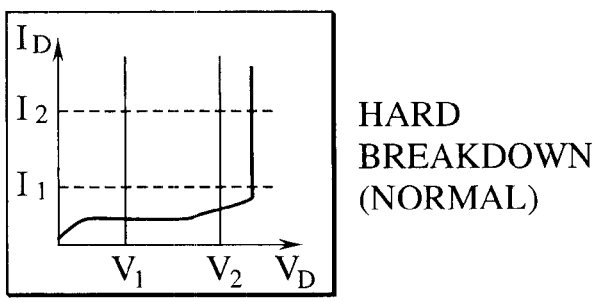
FIG.7C  HARD BREAKDOWN (NORMAL)
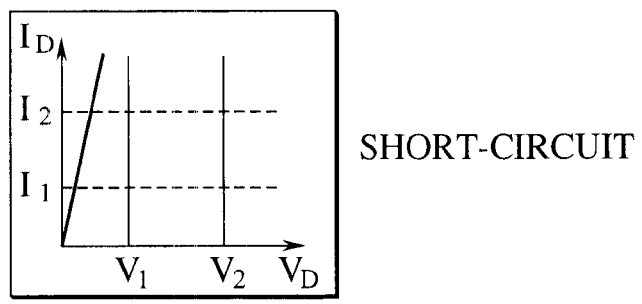
FIG.7D  SHORT-CIRCUIT
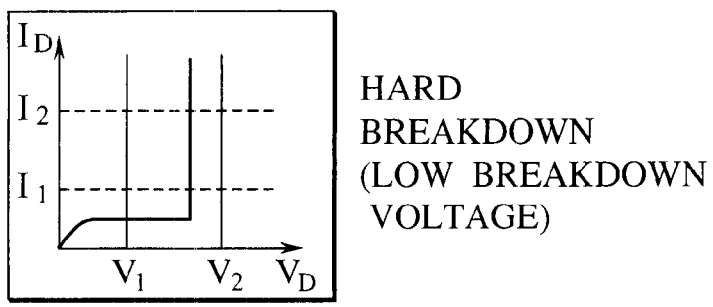
FIG.7E  HARD BREAKDOWN (LOW BREAKDOWN VOLTAGE)

FIG.12

| INDEXES | 0 | 1 | 2 | 3 | 4 | 5 | 6 | 7 | ------ | n |
|---|---|---|---|---|---|---|---|---|---|---|
| VOLTAGES | $v_0$ | $v_1$ | $v_2$ | $v_3$ | $v_4$ | $v_5$ | $v_6$ | $v_7$ | ------ | $v_n$ |
| CURRENTS WITH $t_1$ | $i_0$ | $i_1$ | $i_2$ | $i_3$ | $i_4$ | $i_5$ | $i_6$ | $i_7$ | ------ | $i_n$ |
| CURRENTS WITH $t_2$ | $k_0$ | $k_1$ | $k_2$ | $k_3$ | $k_4$ | $k_5$ | $k_6$ | $k_7$ | ------ | $k_n$ |

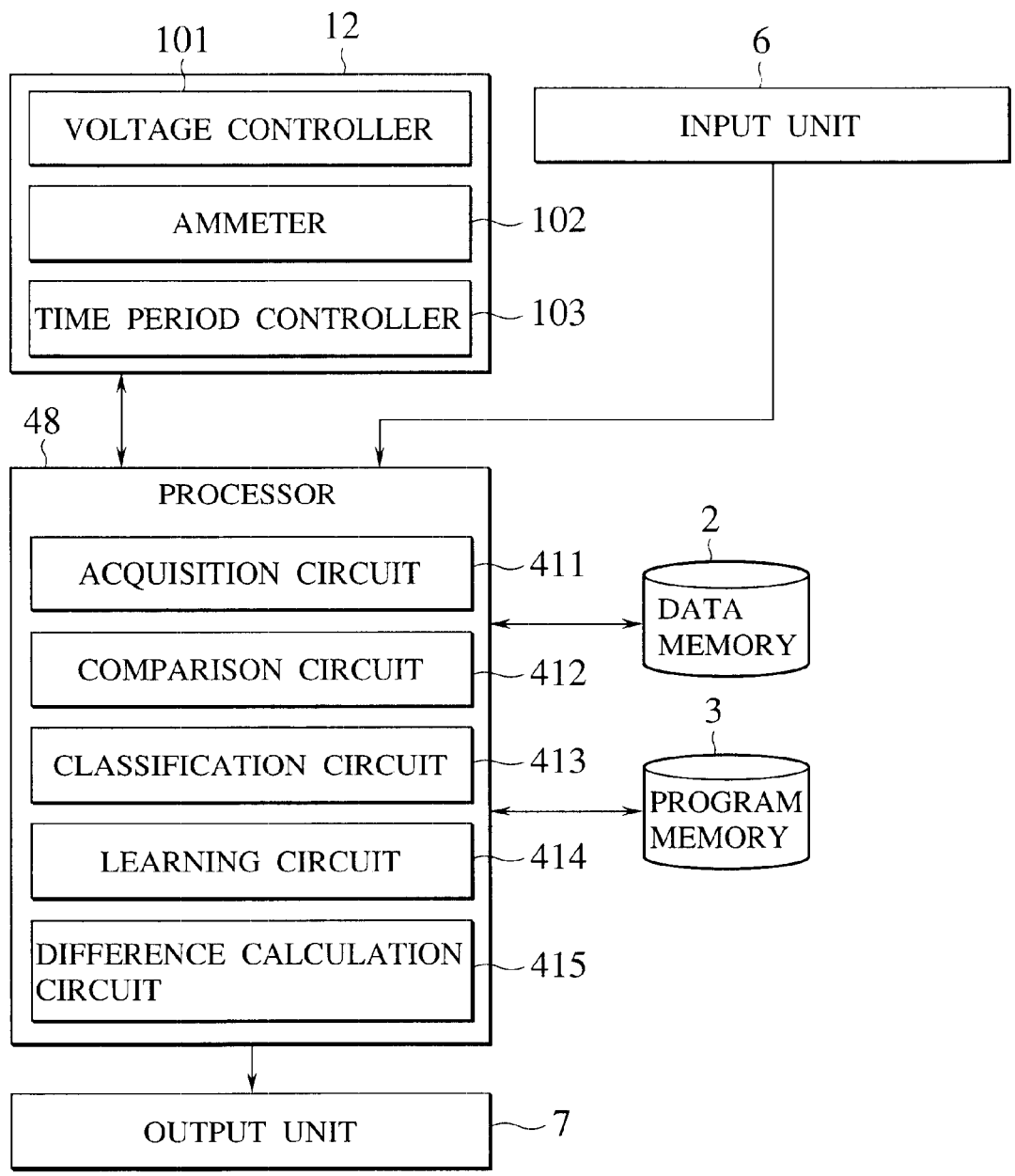

AUTOMATIC SEMICONDUCTOR DEVICE CLASSIFICATION SYSTEM, METHOD FOR CLASSIFYING SEMICONDUCTOR DEVICE AND RECORDING MEDIUM HAVING PROGRAM FOR THE SYSTEM

BACKGROUND OF THE INVENTION

1. Field of the Invention

The present invention relates to a system and a method for testing semiconductor devices such as transistors and diodes, and more specifically, to an automatic classification system and method for automatically classifying semiconductor devices by determining current-voltage characteristics (hereinafter referred as "the I-V characteristics")thereof with small memory capacity, as well as to a recording medium which is readable by a computer, storing the program for causing the automatic classification system to function and executing the method.

2. Description of the Related Art

At the final stage of manufacturing of field effect transistors (FETs), an examination test of the FETs is generally required. Conventionally, in the examination test, the drain-leakage current of FET is detected by a current measuring unit or a current tester. In the measurement, a specific voltage of predetermined level is applied between source and drain electrodes of FET with gate electrode being open, and the drain-leakage current is measured at the specific voltage. Then, the measured drain-leakage current at the specific voltage was compared with a standard value, and the FET having drain-leakage current not satisfying the standard value is rejected as defective device.

In such a testing, it is possible to screening out defective FET from acceptable FET, according to the detected drain-leakage current measured at the specific voltage, but it is not possible to determine the reason why the defective FET have been resulted to be poor in the manufacturing process. Or, it is not possible to determine the pattern of a characteristic-curve which shows how the drain-leakage current is related to the voltage applied between source and drain electrodes. Therefore, in order to examine the failure mode of the defective devices for further qualification, an I-V curve tracer is required to obtain the I-V characteristics, in addition to the screening device measuring only the drain-leakage current at the specific voltage. The I-V curve tracer measures again the drain-leakage currents of defective FETs supplying sawtooth voltages between source and drain electrodes of each of defective FETs, continuously changing the supply voltages in a certain voltage span. In this case, the classification task of the I-V characteristics must be done manually.

Such a method of manual classification using the results of continuous measurement by the I-V curve tracer requires a tremendous amount of time and labor for classification. In addition, as it takes a long time to analyze the failure modes of the defective devices, it is difficult to quickly respond in case such a failure or trouble is found in the semiconductor device.

Further, since the measurement is carried out with supply voltages continuously changing in the certain voltage span, by the I-V curve tracer, a vast amount of memory capacity has been required for storing the measured data with continuously changing supply voltages.

SUMMARY OF THE INVENTION

The present invention is intended to solve the problems described above and one object of the present invention is to provide an automatic semiconductor device classification system capable of significantly reduce time required for measuring, storing, calculating and classifying I-V characteristics of many semiconductor devices respectively located in respective exposure areas, step-and-repeatedly arranged on a surface of a large-diameter semiconductor wafers so as to manufacture a plurality of semiconductor devices.

Another object of the present invention is to provide an automatic semiconductor device classification system, capable of classifying I-V characteristics curves of the semiconductor devices without using the I-V curve tracer or the equivalent measuring instruments.

Yet another object of the present invention is to provide an automatic semiconductor device classification system, capable of reducing the number of required testing steps and the "turn-around-time" of the semiconductor devices.

Yet another object of the present invention is to provide a relatively low cost automatic semiconductor device classification system, having a simple system organization and is able to reduce the computer resource (i.e. memory capacity) required for the automatic classification of I-V characteristics.

Yet another object of the present invention is to provide an automatic semiconductor device classification system, having a simple system organization and is able to determine the I-V characteristics of a plurality of semiconductor devices in respective chip areas arranged on surfaces of semiconductor wafers, and thereby produce a classification map of the semiconductor wafer showing the respective I-V characteristics easily and quickly.

Yet another object of the present invention is to provide an automatic semiconductor device classification system, which is capable of significantly reducing time and labor required for analyzing failure modes of semiconductor devices.

Yet another object of the present invention is to provide an automatic semiconductor device classification system in which a shorter development period of a new-type semiconductor device and a quicker remedy response to a failure or trouble occurred in the device can be easily achieved.

Yet another object of the present invention is to provide a method for automatically classifying semiconductor devices in which the amount of time required for sorting-out or for classifying the I-V characteristics of a large number of semiconductor devices can be significantly reduced.

Yet another object of the present invention is to provide a method for automatically classifying semiconductor devices in which the I-V characteristics of the semiconductor devices can be classified into predetermined categories, without using the I-V curve tracer or the equivalent measuring instruments.

Yet another object of the present invention is to provide a method for automatically classifying semiconductor devices in which the turn-around-time" of the semiconductor devices can be reduced.

Yet another object of the present invention is to provide a method for automatically classifying semiconductor devices in which the amount of data required for the computation of the automatic classification can be significantly reduced.

Yet another object of the present invention is to provide a method for automatically classifying semiconductor devices in which a classification map of the I-V characteristics of semiconductor devices arranged on surfaces of semiconductor wafers can be quite easily produced.

Yet another object of the present invention is to provide a method for automatically classifying semiconductor devices in which the amount of time and labor required for analyzing failure modes of the semiconductor devices can be significantly reduced.

Yet another object of the present invention is to provide a method for automatically classifying semiconductor devices in which a shorter development period of a new-type semiconductor and a quicker response to failures or troubles can be easily achieved.

Yet another object of the present invention is to provide a recording medium which is readable by a computer and which stores a program for the automatic classification of I-V characteristics, the program being suitable for operating the aforementioned automatic classification system and the method of the semiconductor devices.

In order to achieve the objects described above, a first aspect of the present invention inheres in the automatic semiconductor device classification system comprising a current measuring unit, a data memory, and a processor connected to the data memory and the current measuring unit. The current measuring unit includes a voltage controller and an ammeter. The current measuring unit measures discrete current vs. voltage relations (hereinafter referred as "the I-V relations") between predetermined electrodes of a semiconductor device, using discrete output voltages of the voltage controller. The data memory stores the discrete I-V relations, a first control voltage, a first threshold current value at the first control voltage, a second control voltage which is larger than the first control voltage, and a second threshold current value at the second control voltage. The processor includes an acquisition circuit which obtains the decision current values, a comparison circuit which compares the decision current values with the threshold current values and is connected to the acquisition circuit, and a classification circuit which execute the pattern-determination and classification and is connected to the comparison circuit. In the acquisition circuit, the first decision current value at the first control voltage and the second decision current value at the second control voltage are obtained using the discrete I-V relations stored in the data memory. In the comparison circuit, the first decision current value is compared with the first threshold current value stored in the data memory and the second decision current value is compared with the second threshold current value stored in the data memory. Finally, in the classification circuit, a pattern of the curve representing an approximate I-V characteristic between the predetermined electrodes is determined on the basis of the comparison results obtained by the comparison circuit, and classification into predetermined category is performed according to this determination. The acquisition circuit, the comparison circuit and the classification circuit may have the dedicated hardwares respectively, or may comprises a general purpose computer system in which the respective functions of the circuits are defined by the instructions given by a software program.

The "semiconductor device" tested by the automatic classification system according to the first aspect of the present invention may include diodes and transistors. The transistors may include bipolar transistors(BJTs), FETs and static induction transistors(SITs). The diodes may include semiconductor light-emitting devices such as light-emitting diodes(LEDs) and semiconductor laser diodes(LDs). The gate structure of FET and SIT may be an insulated gate structure such as MOSFET, MISFET, a pn junction structure or a Schottky gate structure. High electron mobility transistors (HEMT) having a heterojunction gate may also be included in the transistor having the insulated gate structure. In addition, the "semiconductor devices" of the present invention may further include insulated gate bipolar transistors (IGBTs), gate-turn-off(GTO) thyristors, static induction thyristors(SI thyristors), and MOS composite devices such as emitter-switched thyristors(ESTs). In the present invention, "between the predetermined electrodes of a semiconductor device" means couples of electrodes between anode and cathode electrodes of a diode, between emitter and collector electrodes or between emitter and base when $I_1<i_{d1}$ and $i_{d1}<I_2$ and $I_1<i_{d2}$ and $i_{d2}<I_2$, it is determined to be "channel". gate electrodes of FET (or SIT), between anode and cathode electrodes of GTO when $i_{d1}<I_1$ and $I_1<I_{d2}$ and $i_{d2}<I_2$, it is determined to be "soft break down".

According to the automatic classification system of the first aspect of when $I_2<i_{d1}$ and $I_2<I_{d2}$, it is determined to be "short circuit failure". whether the reverse I-V characteristics between source and drain electrodes of when $i_{d1}<I_1$ and $I_2<I_{d2}$, it is determined to be "hard break down (low breakdown voltage)". hard-breakdown characteristics, is automatically carried out and then when $i_{d1}<I_1$ and $i_{d2}<I_2$, it is determined to be "hard break down (normal)". As the curve pattern showing the approximate I-V characteristics of the semiconductor device can be automatically classified, the discrete I-V relations can be thoroughly measured for a plurality of semiconductor devices periodically arranged on various semiconductor wafers of 6-inch to 12-inch diameters or the like, and thereby the time required for classifying into the predetermined categories can be effectively reduced. Further, as simply the measurement of the discrete I-V relations by the current measuring unit suffices the classification of the semiconductor device, the I-V curve tracer or the equivalent measuring instrument is not necessary any more and thereby the number of required steps during the testing can be reduced. In a case in which the I-V curve tracer is used, a vast amount of memory capacity is required for storing the measured data because the measurement is continuously carried out, being scanned by sawtooth voltage waves. On the other hand, according to the automatic semiconductor device classification system as the first aspect of the present invention, only about 2 to about 10 items of measured data is needed for one semiconductor device and thus the amount of required memory capacity can be significantly reduced. Yet further, a classification map of the approximate I-V characteristics of a plurality of semiconductor devices in respective chip areas arranged on surfaces of semiconductor wafers can be very easily produced because the pattern of the curve showing the I-V characteristics of the semiconductor device can be automatically classified and thus the required computation time per a semiconductor device is reduced (this task is quite long time and labor-consuming when manually done). Yet further, as the amount of time and labor required for analyzing the failure mode of the semiconductor device is significantly reduced, a new-type semiconductor device can be developed in a shorter period and failures or troubles can be repaired or solved with more quickly.

A second aspect of the present invention inheres in a method for automatically classifying semiconductor devices comprises the steps of: (a) setting a first control voltage, a first threshold current value at the first control voltage, a second control voltage which is larger than the first control voltage, and a second threshold current value at the second control voltage; (b) applying a set of discrete measuring voltages between predetermined electrodes of a semiconductor device and measuring discrete current values flowing between the predetermined electrodes during application of each of the discrete measuring voltages; (c) obtaining "a first decision current value" at the first control voltage and "a second decision current value" at the second control voltage, on the basis of the discrete current values measured in step (b); (d) comparing the first decision current value with the first threshold current value and comparing the second decision current value with the second threshold current value; and (e) determining an approximate I-V characteristic between the predetermined electrodes of the semiconductor device on the basis of the comparison results obtained in step (d) and classifying the approximate I-V characteristic into predetermined category.

According to the method for automatically classifying semiconductor devices of the second aspect of the present invention, since the curve pattern representing the I-V characteristics of the semiconductor device can be automatically classified, the discrete I-V relations can be thoroughly measured for each of a plurality of semiconductor devices arranged on surfaces of semiconductor wafers of large diameter, and thereby the time required for classifying into the predetermined categories can be effectively reduced. Further, since only the measurement of the discrete I-V relations by the current measuring unit suffices for the classification of the semiconductor devices, the I-V curve tracer or the equivalent measuring instrument is not necessary any more and thereby the number of required steps during the testing can be reduced. And, only a few items of measured data is needed for calculation and determination of the approximate I-V characteristics of one semiconductor device, and thus the amount of required memory capacity can be significantly reduced. Yet further, a classification map of the approximate I-V characteristics of the semiconductor device can be very easily produced because the required computation time per a semiconductor device is reduced. Yet further, as the amount of time and labor required for analyzing the failure mode of the semiconductor device is significantly reduced, a new-type semiconductor device can be developed in a shorter period and failures or troubles can be coped with more quickly.

A program for realizing the method for automatically classifying the semiconductor devices described as the second aspect of the present invention can be executed by storing the program in a recording medium which is readable by a computer, and then making a computer read out the program (the computer constitutes the automatic classification system described in the first aspect of the present invention). More specifically, a third aspect of the present invention lies in the program stored in the recording medium readable by the computer and which includes the steps of: (a) setting a first control voltage, a first threshold current value at the first control voltage, a second control voltage which is larger than the first control voltage, and a second threshold current value at the second control voltage; (b) applying a set of discrete measuring voltages between the predetermined electrodes of the semiconductor device and outputting a code for instructing measurement of discrete current values flowing between the predetermined electrodes during application of each of the discrete measuring voltages; (c) obtaining a first decision current value at the first control voltage and a second decision current value at the second control voltage, on the basis of the discrete current values measured in step (b); (d) comparing the first decision current value with the first threshold current value and comparing the second decision current value with the second threshold current value; and (e) determining an approximate I-V characteristic between the predetermined electrodes of the semiconductor device on the basis of the comparison results obtained in step (d) and classifying the approximate I-V characteristic into predetermined category.

Herein, the "recording medium" may be a main memory unit or an external memory unit of a computer system, as long as it is the medium in which a program can be stored. The "recording medium" may include a semiconductor memory, a magnetic disk such as a flexible disk or a floppy disk, an optical disk such as a compact disk (CD)-ROM, a magneto-optical(MO)disk, and a magnetic tape such as a cassette tape, and an open reel tape.

Other and further objects and features of the present invention will become obvious upon an understanding of the illustrative embodiments about to be described in connection with the accompanying drawings or will be indicated in the appended claims, and various technical advantages not referred to herein will occur to one skilled in the art upon employing of the invention in practice.

BRIEF DESCRIPTION OF THE DRAWINGS

FIG. 3 is a view showing an example of data structure when measured discrete I-V relations are stored to the data memory in the first embodiment of the present invention.

FIGS. 7A to 7E are views showing various examples of approximate I-V characteristics.

FIG. 12 is a view showing an example of data structure obtained with different time periods of the measuring voltage.

FIG. 19 is a schematic block diagram showing a structure of an automatic semiconductor device classification system according to yet another embodiment of the present invention.

DETAILED DESCRIPTION OF THE PREFERRED EMBODIMENTS

Figure 1:
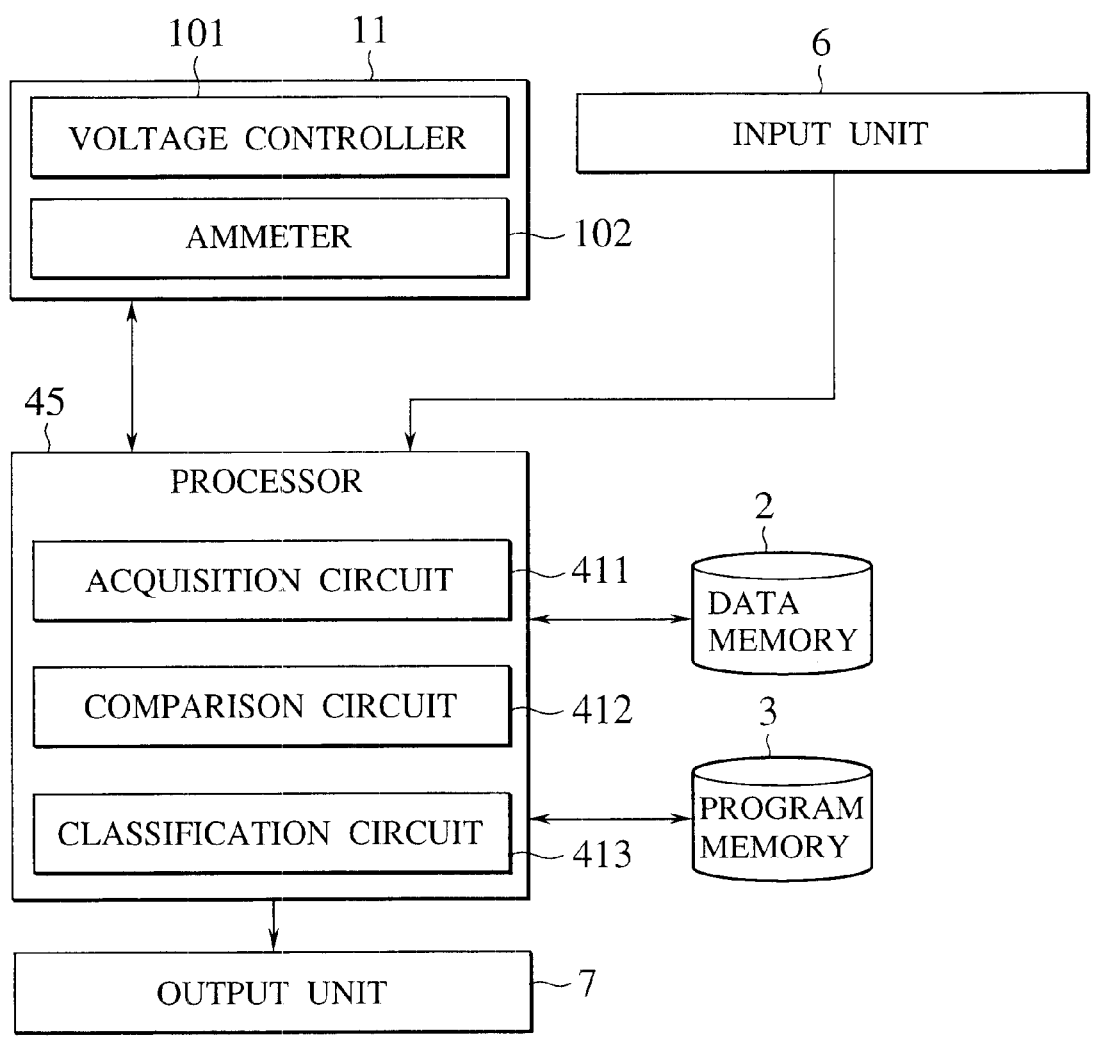
FIG. 1 is a schematic block diagram showing a structure of an automatic semiconductor device classification system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set fourth such as specific values, etc. to provide a through understanding of the present invention. However, it will be obvious to those skilled in the art that the present invention may be practiced without such specific details. In other instances, well-known units or circuits have been shown in block diagram form in order not to obscure the present invention in unnecessary detail.

First Embodiment

As shown in FIG. 1, an automatic semiconductor device classification system according to a first embodiment of the present invention at least includes, a current measuring unit 11, a data memory 2 for storing predetermined data necessary for automatic classification of semiconductor devices, a program memory 3 in which a classification program or the like is stored and a processor 45 connected to the data memory 2, the program memory 3 and the current measuring unit 11. The processor 45 has a function of executing a sequence of operations, for automatically classifying I-V characteristics of semiconductor devices. The automatic semiconductor device classification system of the first embodiment of the present invention further include an input unit 6 for accepting inputs of data and/or command from an operator, and an output unit 7 for outputting classified results.

The current measuring unit 11 includes a voltage controller 101 and an ammeter 102, and measures the discrete I-V relations between predetermined electrodes of the semiconductor device by using discrete output voltages of the voltage controller 101. The data memory 2 stores the discrete I-V relations which have been measured by the current measuring unit 11, and further stores a first control voltage, a first threshold current value at the first control voltage, a second control voltage which is larger than the first control voltage, and a second threshold current value at the second control voltage. The data memory 2 is a memory unit utilizing a magnetic tape, a magnetic drum, a magnetic disk, an optical disk, a magneto-optical disk of known type or a semiconductor memory such as ROM, RAM or the like. The program memory 3 is a memory unit utilizing the magnetic tape, the magnetic drum, the magnetic disk, the optical disk, the magneto-optical disk of known type or a semiconductor memory or the like. The processor 45 includes an acquisition circuit 411 which obtains the decision current values, a comparison circuit 412 which compares the decision current values with the threshold current values and is connected to the acquisition circuit 411, and a classification circuit 413 executes the pattern-determination and classification opera-tions and is connected to the comparison circuit. In the acquisition circuit 411, the first decision current value at the first control voltage and the second decision current value at the second control voltage are obtained using the measured results stored in the data memory 2. In the comparison circuit 412, the first decision current value is compared with the first threshold current value stored in the data memory 2 and the second decision current value is compared with the second threshold current value stored in the data memory 2. Finally, in the classification circuit 413, the pattern of the curve representing the approximate I-V characteristics between the predetermined electrodes is determined on the basis of the comparison results obtained by the comparison circuit 412 and classification is performed according to this determination. The acquisition circuit 411, the comparison circuit 412 and the classification circuit 413 may have the dedicated circuits ,(hardwares) respectively, or may comprises a general purpose computer system in which the respective functions of the circuits are defined by the instructions given by a software program. In FIG. 1, the input unit 6 includes a keyboard, a mouse, a light-pen or a floppy-disk driver or the like. The output unit 7 includes a display device and a printer and outputs the classified results from the classification circuit 413 as the actual I-V characteristics between electrodes of the semiconductor device.

The input data of each process executed in the processor 45 shown in FIG. 1 is stored in the data memory 2, and the program commands are stored in the program memory 3. Such input data and program commands are optionally read by the processor 45. The data such as information of numerical values generated during the computation process is stored in the data memory 2.

Here, the I-V relation between source and drain electrodes of FET are explained as an example of the "I-V relation between predetermined electrodes of a semiconductor device" of the present invention. In the measurement of the discrete I-V relations of the FET, gate electrode is set to a open state. FET may be a MOSFET or a junction FET. The source-drain structure of FET is equivalent with the structure between two electrodes of a diode having npn or pnp structure. The source-drain structure of double-diffused MOSFET (DMOS) is equivalent with the structure between two electrodes of a diode having the npin, pnip structure.

In addition, in the first embodiment of the present invention, it is assumed that a considerable number of FETs whose gate electrodes are set open are arranged in each exposure areas to define chip areas on a surface of a semiconductor wafer (a silicon wafer). The chip areas have been, for example, exposed in the "step-and-repeat" manner by a stepper-scanner lithography machine (See FIG. 8A). With the prepositions as described above, a method for automatically classifying semiconductor devices of the first embodiment of the present invention will be described hereinafter according to the flow chart shown in FIG. 2.

(a) First, in step S101, a first control voltage ($V_1$), the first threshold current value ($I_1$) at the first control voltage ($V_1$), the second control voltage ($V_2$) which is larger than the first control voltage ($V_1$), and the second threshold current value ($I_2$) at the second control voltage ($V_2$) are set. The first threshold current value ($I_1$) provides an acceptable value of the drain-leakage current when the first control voltage ($V_1$) is applied between source and drain electrodes of FET. The second threshold current value ($I_2$) provides the acceptable value of the drain-leakage current when the second control voltage ($V_2$) is applied between source and drain electrodes of FET. A FET in which a drain-leakage current not less than the second threshold current value ($I_2$) flows is determined to be defective. The first control voltage ($V_1$), the first threshold current value ($I_1$), the second control voltage ($V_2$), and the second threshold current value ($I_2$) are determined in accordance with the rated maximum operating voltage and the like of FET, respectively. For example, in the case of power FET, the second control voltage ($V_2$) is set to be 600 V, 800 V, 1000 V, ..., or in a similar way. In the case of FET for small signals, the second control voltage ($V_2$) is set about 100 V or in some cases at a value less than 100 V. Next, in step S102, the first control voltage ($V_1$), the first threshold current value ($I_1$), the second control voltage ($V_2$), and the second threshold current value ($I_2$) are stored in the data memory 2.

(b) Next, in step S103, a set of discrete measuring voltages ($v_0, v_1, v_2, \ldots, v_n$) for measurement is each applied between the source and drain electrodes of FET by using the voltage controller 101 of the current measuring unit 11. Then, each current value (drain-leakage current) flowing between the source and drain electrodes when each of the plurality of measuring voltages ($v_0, v_1, v_2, \ldots, v_n$) is applied in reverse direction is measured.

Figure 4:
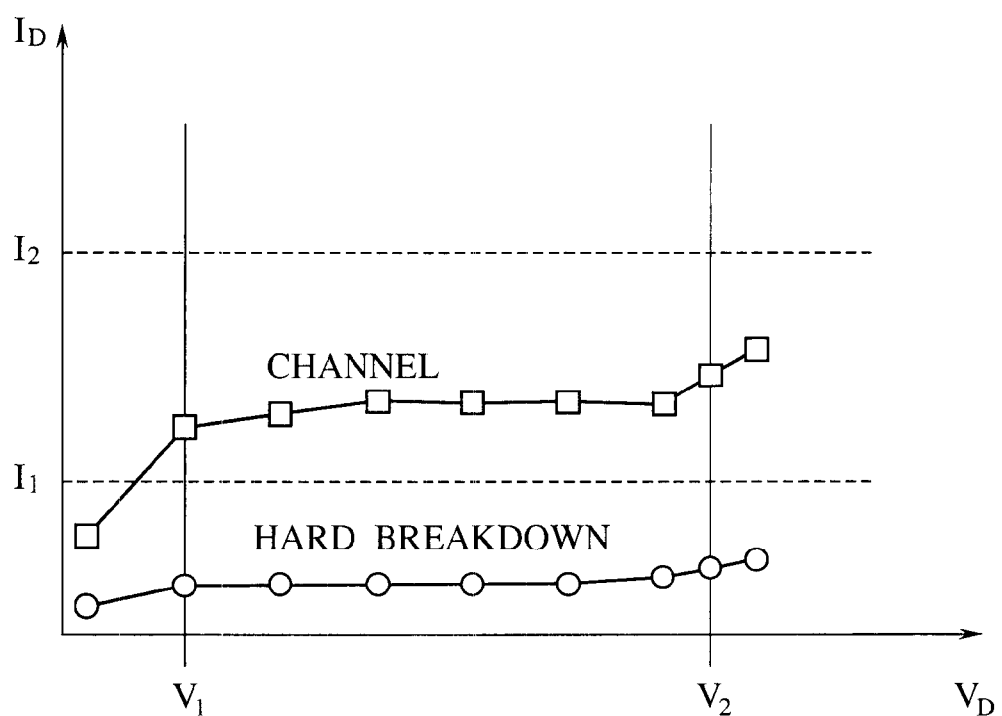
FIG. 4 is a view showing an example of outputting the measured data in a display.
Figure 8B:
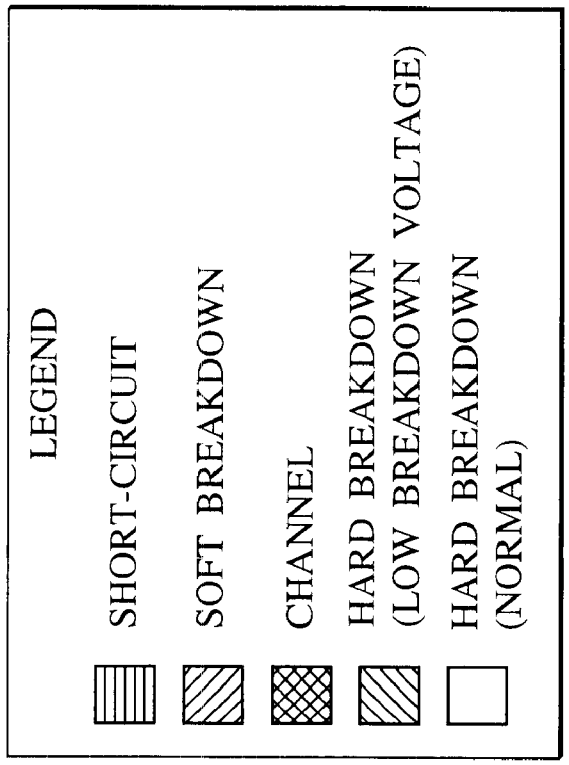
FIG. 8B is a view showing a typical example of symbols on the classification map of FIG. 8A.
Figure 8A:
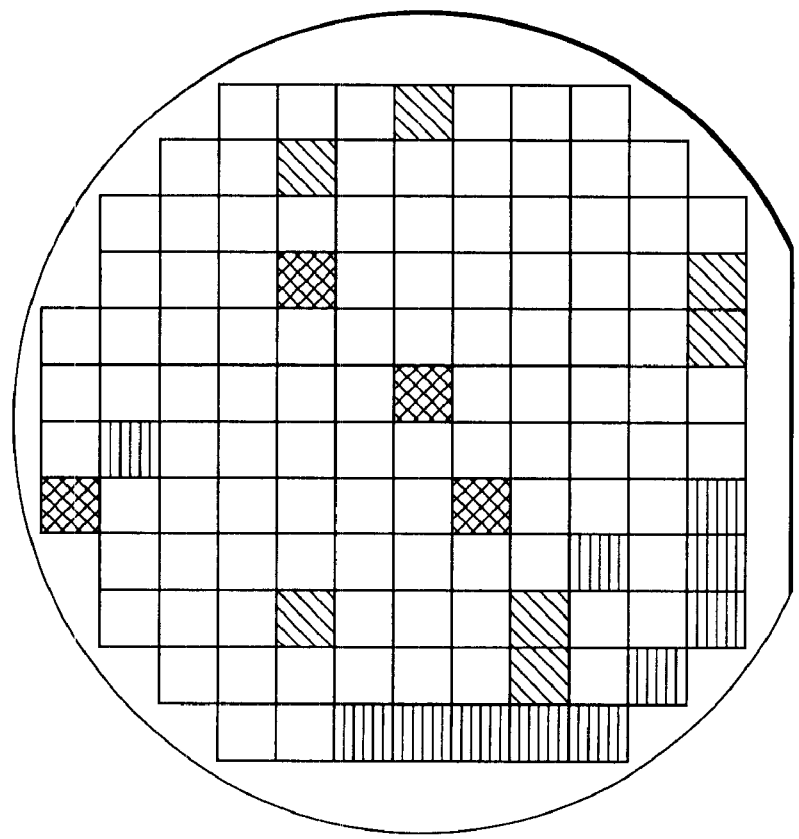
FIG. 8A is a view showing an example of classification map on a surface of semiconductor wafer.

In step S104, the discrete current values ($i_0, i_1, i_2, \ldots, i_n$) measured in step S103 are stored in the data memory 2. Herein, indices, the discrete measuring voltages ($v_0, v_1, v_2, \ldots, v_n$) and the discrete measured current values ($i_0, i_1, i_2, \ldots, i_n$) are stored in the data memory 2 to constitute a data structure such as shown in FIG. 3. As the indices, the array positions on a surface of a semiconductor wafer (silicon wafer) as shown in FIG. 8A, the wafer number, the lot number and the like may be optionally added. The data stored in the data memory 2 is output in the display of the output unit 7 as shown in FIG. 4 to show the discrete relations of drain voltages ($V_D$) vs. the drain currents ($I_D$).

Figure 2:
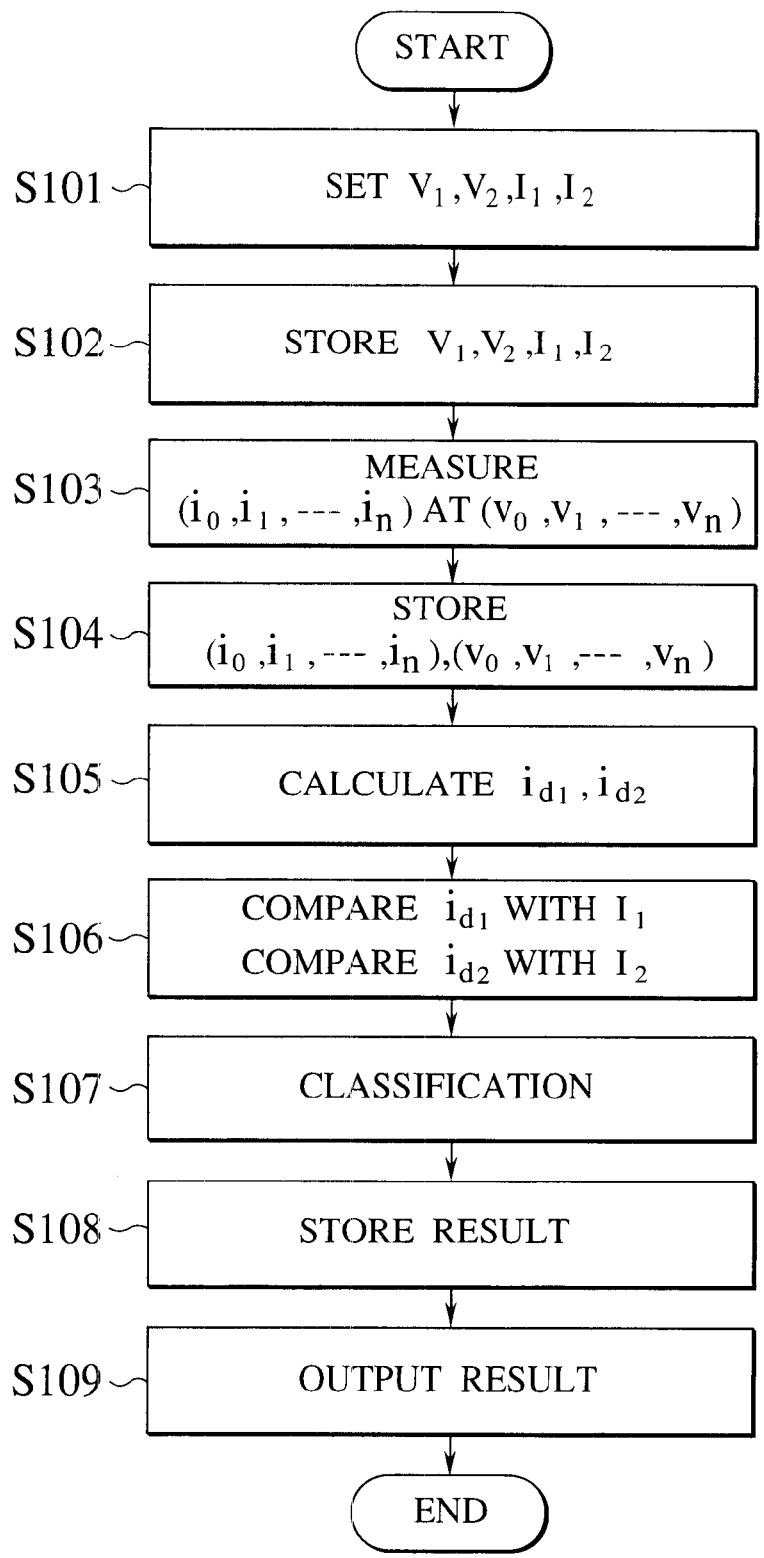
FIG. 2 is a flow chart which illustrates a method for automatically classifying semiconductor devices according to the first embodiment of the present invention.
Figure 5:
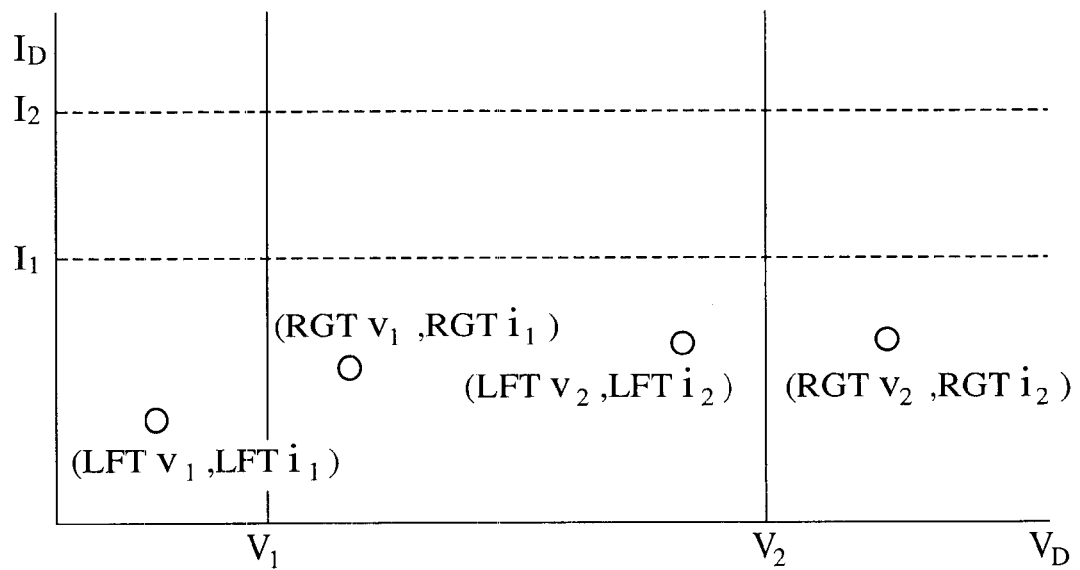
FIG. 5 is a view showing how to obtain a current value corresponding to a control voltage of I-V characteristics.
Figure 6:
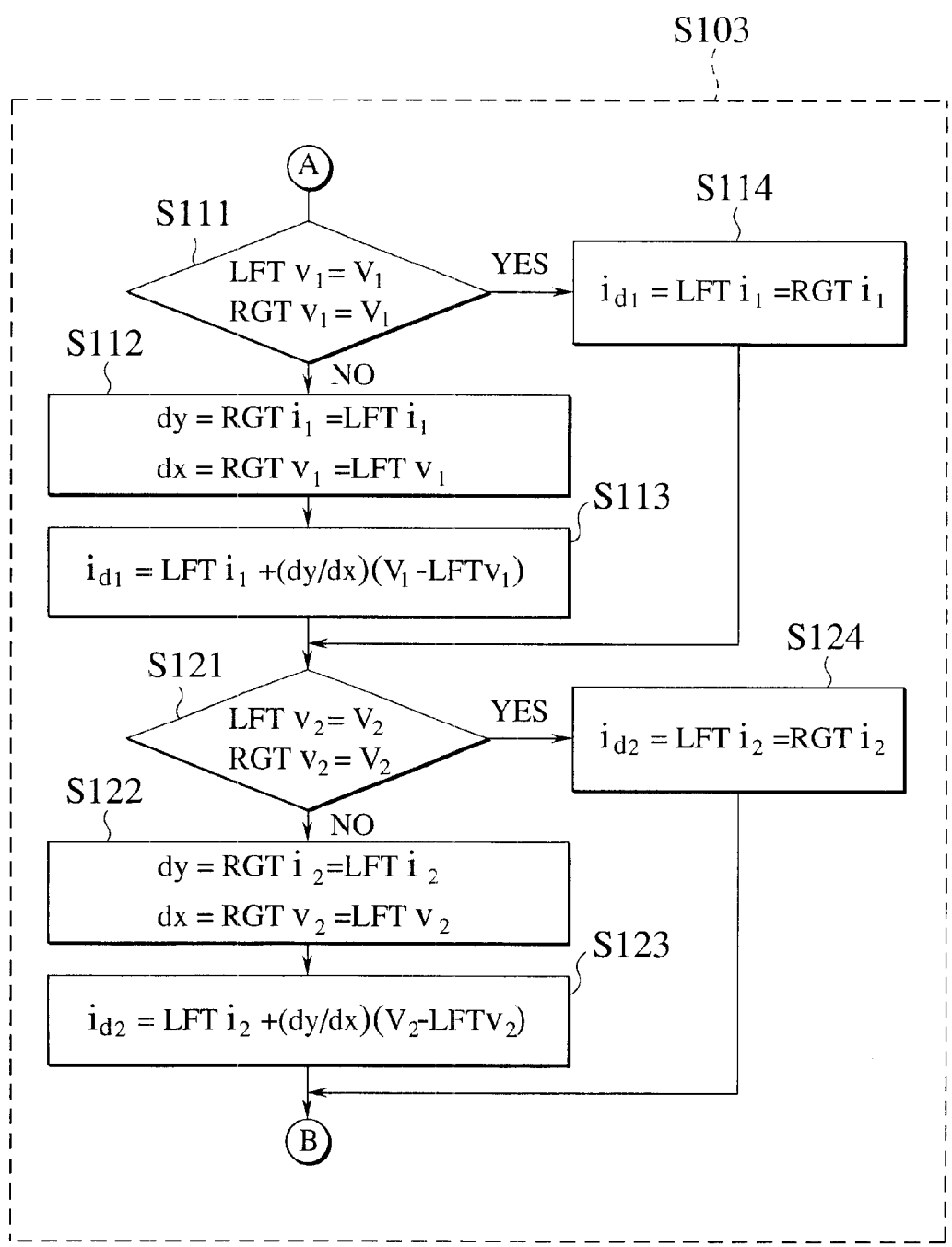
FIG. 6 is a flow chart showing the content of step S105 of the flow chart of FIG. 2.

(c) Next, in step S105, by the acquisition circuit 411, the first decision current value ($I_{d1}$) at the first control voltage ($V_1$), and the second decision current value ($I_{d2}$) at the second control voltage ($V_2$) are obtained using the discrete measured current values ($i_0, i_1, i_2, \ldots, i_n$) by the acquisition circuit 411, respectively, as shown in FIG. 5 (FIG. 6 is a flow chart which illustrates the content of step S105 in the flow chart shown in FIG. 2).

At first, a measuring voltage which is higher than and closest to the control voltage $V_1$, a measuring voltage which is lower than and closest to the control voltage $V_1$, a measuring voltage which is higher than and closest to the control voltage $V_2$, a measuring voltage which is lower than and closest to the control voltage $V_2$, are elected. And "Array index", "Voltage value" and "Current value" at each of the elected measuring voltages are defined as follows:

(1) Measured data on the left side of $V_1 (<V_1)$
  Array index: $i/v_1/L$ (if it does not exist, "−1" is denoted.)
  Voltage value: LFT $v_1$
  Current value: LFT $i_1$
(2) Measured data on the right side of $V_1 (>V_1)$
  Array index: $i/v_1/R$ (if it does not exist, "−1" is denoted.)
  Voltage value: RGT $v_1$
  Current value: RGT $i_1$
(3) Measured data on the left side of $V_2 (<V_2)$
  Array index: $i/v_2/L$ (if it does not exist, "−1" is denoted.)
  Voltage value: LFT $v_2$
  Current value: LFT $i_2$
(4) Measured data on the right side of $V_2 (>V_2)$
  Array index: $i/v_2/R$ (if it does not exist, "−1" is denoted.)
  Voltage value: RGT $v_2$
  Current value: RGT $i_2$ Then, in step S111 and S121 of the flow chart shown in FIG. 6, it is judged whether any measured current value is existing at the control voltages ($V_1$), ($V_2$) or not. If the result of the determination in step S111 or S121 is affirmative, namely, if any measured current value is existing at the control voltages ($V_1$), ($V_2$), the measured current value at the voltage $V_1$ (i.e. the first decision current value) $i_{d1}$ and the measured current value at the voltage $V_2$ (i.e. the second decision current value) $i_{d2}$ are represented respectively as follows (See step S114 and step S124 in FIG. 6):

$$i_{d1} = \text{LFT } i_1 = \text{RGT } i_1$$

$$i_{d2} = \text{LFT } i_2 = \text{RGT } i_2$$

On the contrary, if the result of the determination in step S111 or S121 of the flow chart shown in FIG. 6 is negative, namely, if no measured current value is existing at the control voltages ($V_1$), ($V_2$), the current value on $V_1$ (the first decision current value) $i_{d1}$ and the current value on $V_2$ (the second decision current value) $i_{d2}$ are obtained respectively by the acquisition circuit 411 according to the calculation formulae shown below (See step S112 to S113 and step S123 in FIG. 6 ):

$$dy = (\text{RGT } i_1 - \text{LFT } i_1)$$

$$dx = (\text{RGT } v_1 - \text{LFT } v_1)$$

$$i_{d1} = \text{LFT } i_1 + (dy/dx) \times (V_1 - \text{LFT } v_1)$$

$$dy = (\text{RGT } i_2 31 \text{ LFT } i_2)$$

$$dx = (\text{RGT } v_2 - \text{LFT } v_2)$$

$$i_{d2} = \text{LFT } i_2 + (dy/dx) \times (V_2 - \text{LFT } v_2)$$

(d) In step S106 shown in FIG. 2, the first decision current value ($i_{d1}$) is compared with the first threshold current value ($I_1$), and the second decision current value ($i_{d2}$) is compared with the second threshold current value ($I_2$) by the comparison circuit 412.

(e) In step S107, on the basis of the comparison results from step S106, approximate I-V characteristics between the predetermined electrodes of the semiconductor are determined and then classified into a predetermined category by the classification circuit 413. Specifically, the pattern of the curve representing the I-V characteristics are classified as follows:

When $i_1 < i_{d1}$ and $i_{d1} < I_2$ and $i_1 < i_{d2}$ and $i_{d2} < I_2$, it is determined to be "channel".

When $i_{d1} < i_1$ and $i_1 < I_{d2}$ and $i_{d2} < i_2$, it is determined to be "soft break down".

When $i_2 < i_{d1}$ and $i_2 < I_{d2}$, it is determined to be "short circuit failure".

When $i_{d1} < i_1$ and $i_2 < I_{d2}$, it is determined to be "hard break down(low breakdown voltage)".

When $i_{d1} < i_1$ and $i_{d2} < I_2$, it is determined to be "hard break down (normal)".

It should be noted that this determination/classification is equivalent with the following determination/classification (except for cases in which the current values at $V_1$, $V_2$ cannot be calculated from the measuring point):

(1) When $i/v_1/L = -1$ and $i/v_1/R = -1$ and $i/v_2/L = -1$ and $i/v_2/R = -1$, it is determined to be "short circuit failure" (a case in which the measuring voltages on neither sides of V1, V2 are present).

(2) When $i/v_1/L \geqq 0$ and $i/v_1/R = -1$ and $i/v_2/L = -1$ and $i/v_2/R = -1$, it is determined to be "short circuit failure" (a case in which all of the measuring voltages are smaller than V1).

(3) When $i/v_1/L = -1$ and $i/v_1/R \geqq 0$ and $i/v_2/L \geqq 0$ and $i/v_2/R = -1$, it is determined to be "hard break down (low breakdown voltage)" (a case in which all of the measuring voltages are between $V_1$ and $V_2$).

(4) When $i/v_1/L = -1$ and $i/v_1/R \geqq -1$ and $i/v_2/L = -1$ and $i/v_2/R \geqq 0$, and $i_1 > i \ (i/v_2/R)$, it is determined to be "hard break down(normal)" (a case in which all of the voltages are larger than $V_2$ and the current value is not more than the threshold current value $i_1$).

When $i/v_1/L = -1$ and $i/v_1/R \geqq -1$ and $i/v_2/L = -1$ and $i/v_2/R \geqq 0$ and $i_1 < i \ (i/v_2/R)$, it is determined to be "hard break down(low breakdown voltage)" (a case in which all of the voltages are larger than $V_2$ and the current value is not less than the threshold current value $I_1$).

In step S108, the measured results and the classified results are stored in the data memory 2 or a temporarily memory.

(f) Finally, in step S109, the approximate I-V characteristics which have been classified according to the respective measured data are output in a monitor display as shown in FIGS. 7A to 7E, for example, and then optionally are printed out.

Further, the approximate I-V characteristics of FET in the respective exposure areas obtained as described above may be expressed as "a classification map" on a surface of semiconductor wafer as shown in FIG. 8A. The classification map, in which the distribution of the classified categories (see the legend shown in FIG. 8B) of the approximate I-V characteristics on the surface of the semiconductor wafer is included, may be output on the display in the output unit 7.

In the method for automatically classifying semiconductor devices using the automatic classification system according to the first embodiment of the present invention, as the shape patterns of the curves showing the I-V characteristics of the semiconductor device (FET) can be automatically classified, the time required for classifying the I-V characteristics of semiconductor devices in which a number of semiconductor devices are arranged on surfaces of semiconductor wafers can be significantly reduced as a whole. In addition, to execute such classification of the approximate I-V characteristics of semiconductor devices, all what is needed is measurement of the discrete I-V relation data by the current measuring unit and calculation on the discrete I-V relation data. Therefore, continuous measurement by the I-V curve tracer or the equivalent measuring instrument is not necessary any more and thus the number of steps required for testing and inspecting semiconductor devices can be reduced. Conventionally, when the I-V curve tracer or the equivalent measuring instrument is used, a tremendous amount of memory capacity is needed in order to store the measured data in the data memory because measurement is continuously carried out by sawtooth voltage waves. However, according to the system and the method for automatically classifying semiconductor devices of the first embodiment of the present invention, in order to execute classification of characteristics of the semiconductor device, all what is needed is to memorize about 2 to about 10 discrete items of measured data and thus the memory capacity can be significantly reduced. Because the shape patterns of the curves representing the I-V characteristics of semiconductor devices can be automatically classified by small number of discrete data, and also because the computation time required per one semiconductor device for classifying characteristics of each one semiconductor device is reduced, a characteristics-distribution map of the semiconductor device on a surface of a semiconductor wafer can be very easily produced (this task is extremely time consuming and labor consuming when manually performed).

In addition to the aforementioned technical advantages, the automatic semiconductor device classification system and method of the first embodiment allows a significant reduction of time and labor required for analyzing the failure mode of semiconductor devices and also allows a shorter period for developing a semiconductor of a new type, as well as a much quicker response to failures or troubles observed in the semiconductor devices.

Figure 9:
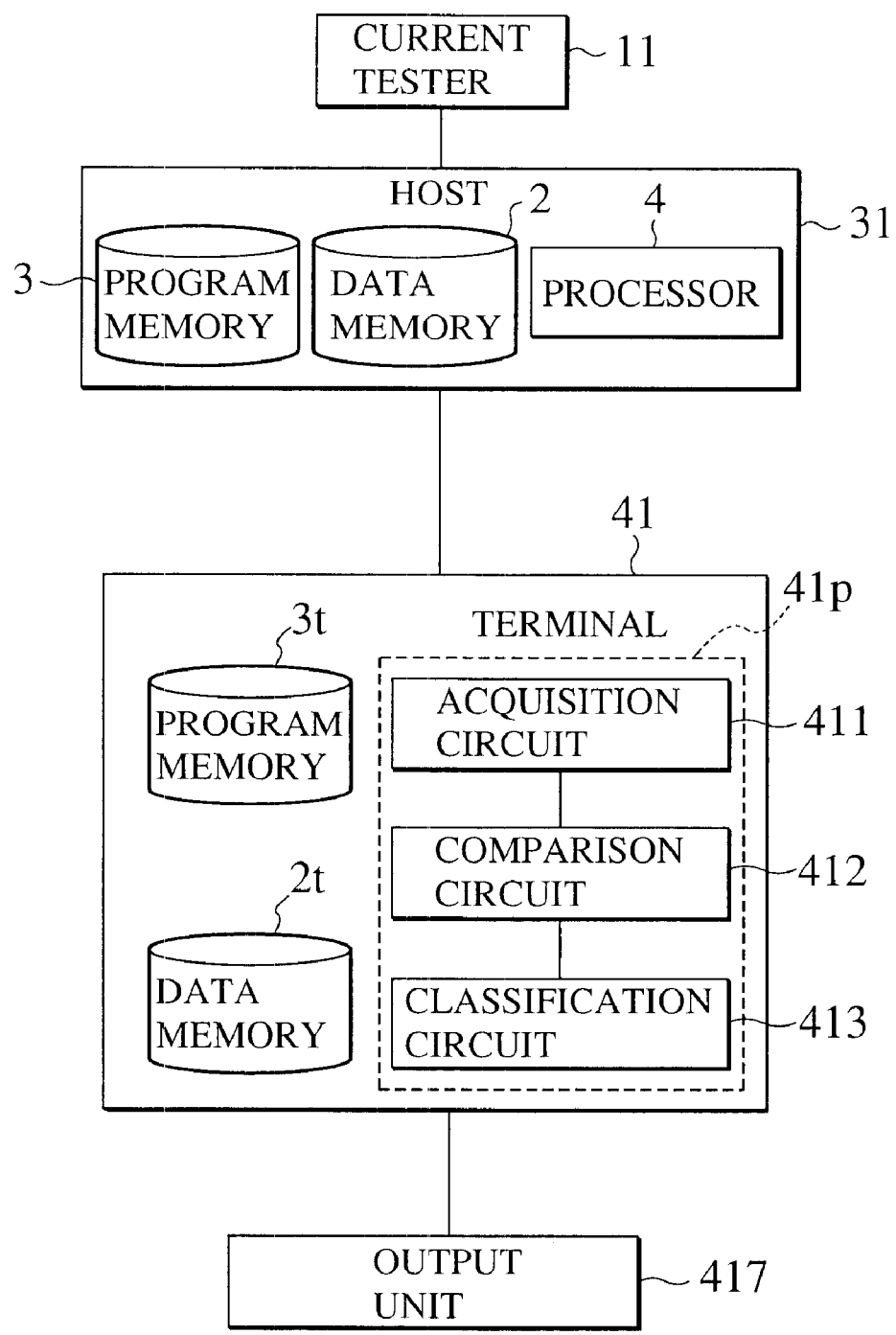
FIG. 9 is a schematic block diagram showing a structure of an automatic semiconductor device classification system according to a modified example of the first embodiment of the present invention.

FIG. 9 is a schematic block diagram showing a structure of the automatic semiconductor device classification system according to a modified example of the first embodiment of the present invention. As shown in FIG. 9, the automatic semiconductor device classification system according to a modified example of the first embodiment of the present invention has a "peer-to-peer" type network including the current measuring unit 11 for measuring discrete I-V relations between the predetermined electrodes of a semiconductor device, a first computer (host computer) 31 connected to the current measuring unit 11, a second computer (terminal computer) 41 connected to the first computer 31, an output unit 417 connected to the second computer 41. The data memory 2, which stores the measured results obtained by the current device 11, the first control voltage, the first threshold current value, the second control voltage, and the second threshold current value, is installed in the first computer 31. The program memory 3 and the processor 4 are further installed in the first computer 31. The processor 41p, which includes the acquisition circuit 411, the comparison circuit 412 connected to the acquisition circuit 411, the classification circuit 413 connected to the comparison circuit 412, is installed in the second computer 41. Further, the second computer 41 includes the data memory 2t, the program memory 3t, and the programs stored in the program memory 3t can instruct the operation of the processor 41p. A plurality of current measuring units 11 may be connected to the first computer 31 such that a plurality of current measuring units 11 are controlled by the first computer 31 and the measured data from the plurality of current measuring units 11 are stored in the data memory 2 installed in the first computer 31.

Figure 10:
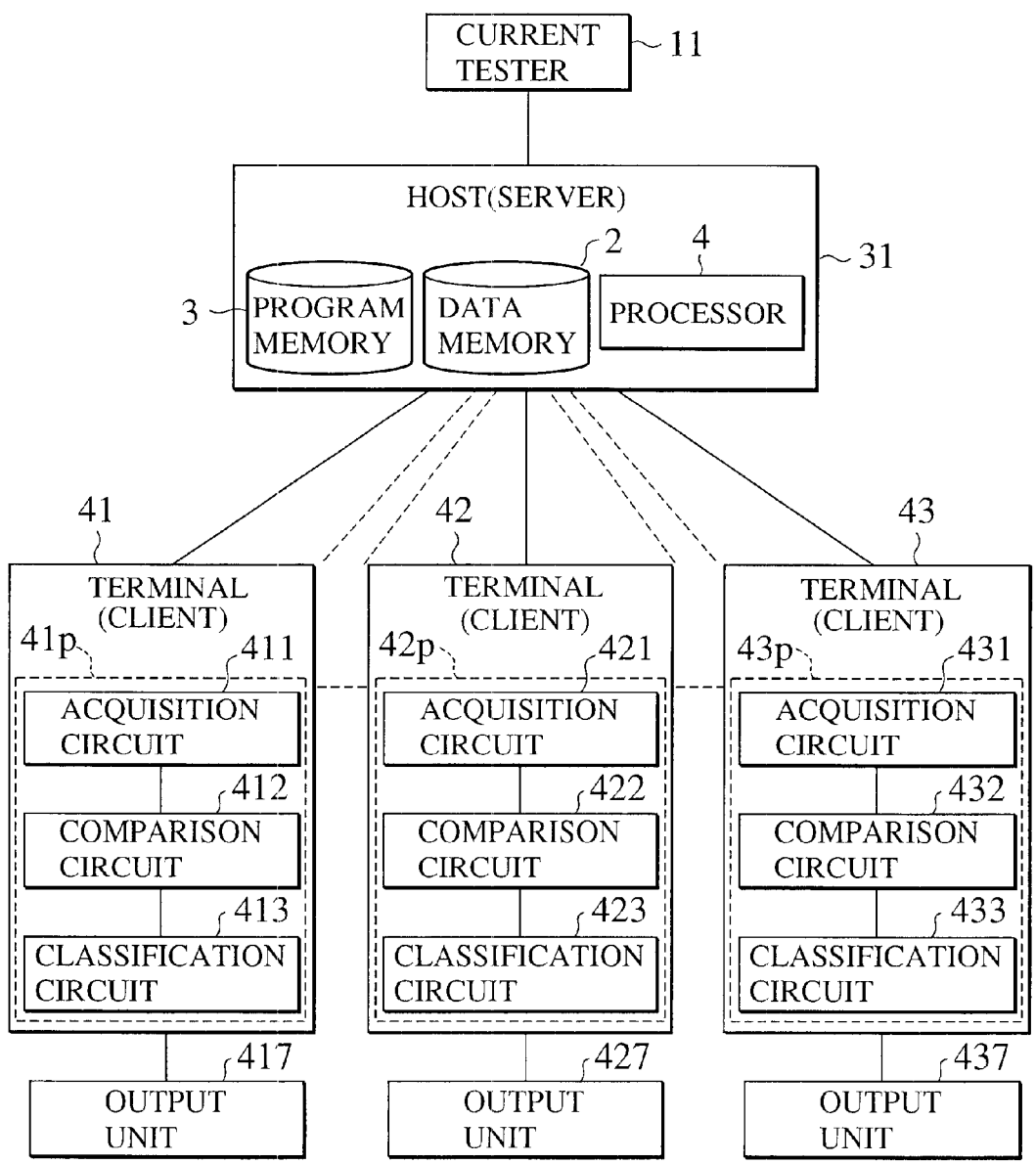
FIG. 10 is a schematic block diagram showing a structure of an automatic semiconductor device classification system according to another modified example of the first embodiment of the present invention.

FIG. 10 is a schematic block diagram showing a structure of the automatic semiconductor device classification system according to another modified example of the first embodiment of the present invention. A network includes the host computer 31 as "a server", and a plurality of terminal computers 41, 42, 43, . . . as "clients" connected to the host computer 31 to construct "the client-server system (CSS)". Similarly to FIG. 9, the current measuring unit 1 for measuring the discrete I-V relations between the predetermined electrodes of a semiconductor device is connected to the host computer 31. The data memory 2, the program memory 3 and a processor 4 are installed in the host computer 31. In each terminal computer 41, 42, 43, . . . processors 41p, 42p, 43p, . . . are installed, respectively. The processor 41p includes the acquisition circuit 411, the comparison circuit 412 connected to the acquisition circuit 411, the classification circuit 413 connected to the comparison circuit 412. The processor 42p includes the acquisition circuit 421, the comparison circuit 422 connected to the acquisition circuit 421, the classification circuit 423 connected to the comparison circuit 422. The processor 43p includes the acquisition circuit 431, the comparison circuit 432 connected to the acquisition circuit 431, the classification circuit 433 connected to the comparison circuit 432. Although not shown in FIG. 10, each terminal computer 41, 42, 43, . . . includes the data memory, the program memory as a matter of course, and the operation of each processor 41p, 42p, 43p . . . can be instructed by the programs stored in the program memories, respectively. Further, to each terminal computer 41, 42, 43, . . . the output units 417, 427, 437, . . . are connected respectively. With such CSS network, the data stored in the data memory 2 of the host computer 31, such as the measured results obtained by the current device 11, the first control voltage, the first threshold current value, the second control voltage, and the second threshold current value, can be shared such that each of a plurality of sections or each of a plurality of persons can immediately obtain the information of the automatically classified results of semiconductor devices and the like and can make a quick response or take any necessary action to the failures or troubles generated in the semiconductor devices. Alternatively, (only) the measured results obtained by the current measuring unit 11 which have been stored in the data memory 2 of the host computer 31 may be shared such that the operator at each terminal independently sets the first control voltage, the first threshold current value, the second control voltage, and the second threshold current value, and performs his or her own desired analysis or future planning or the like. Further, a plurality of current measuring units 11 may be connected to the host computer 31 such that a plurality of current measuring units 11 are controlled by the host computer 31 and the measured data from the plurality of current measuring units 11 are stored in the data memory 2 installed in the host computer 31.

RECORDING MEDIUM STORING THE CLASSIFICATION PROGRAM

The program for automatically classifying semiconductor devices shown in the flowcharts of FIG. 2 and FIG. 6 may be stored in a recording medium which is readable by a computer. The program stored in the recording medium may be read out by the computer system as shown in FIG. 1, 9 or 10 and re-stored in the program memory 3 such that the program is executed in the processor 45 and the automatic classification of the approximate I-V characteristics between the predetermined electrodes of the semiconductor device is carried out. Herein, the recording medium readable by the computer includes a medium in which a program can be recorded, such as a magnetic disk, an optical disk, a magneto-optical disk, a magnetic tape. Structures other than the system organization shown in FIG. 1, 9 or 10 are also acceptable and, for example, an external memory unit may be included as such a recording medium. Accordingly, the program for automatically classifying semiconductor devices as shown in FIG. 2 and FIG. 6 may be stored in an external memory unit or the like.

Second Embodiment

Figure 11:
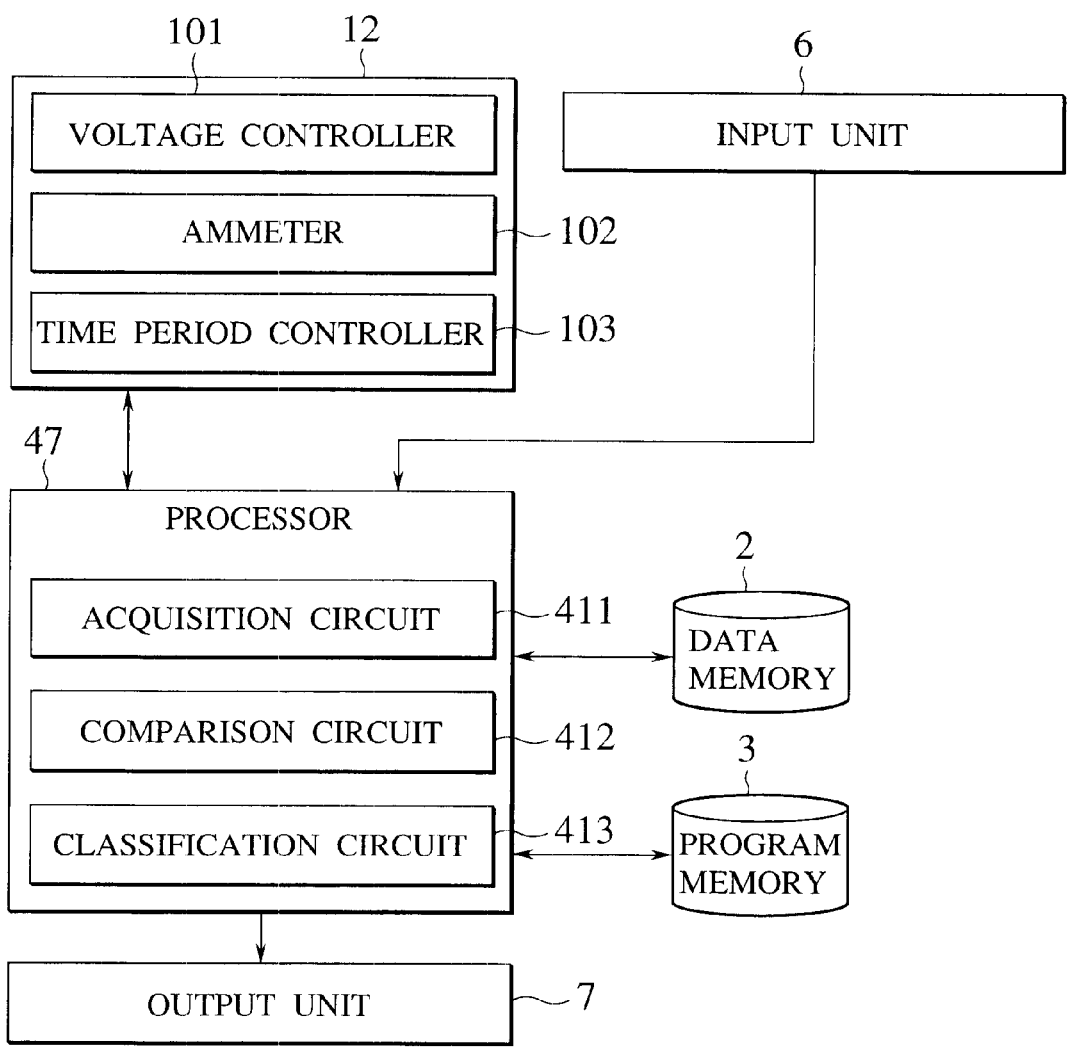
FIG. 11 is a schematic block diagram showing a structure of an automatic semiconductor device classification system according to a second embodiment of the present invention.

An automatic semiconductor device classification system according to a second embodiment of the present invention is, in its basic structure, similar to the system described in the first embodiment of the present invention. However, as shown in FIG. 11, the internal structure of the current measuring unit 12 is different from that described in the first embodiment of the present invention. Specifically, the current measuring unit 12 of the automatic semiconductor device classification system according to the second embodiment of the present invention has a time period controller 103, in addition to the voltage controller 101 and the ammeter 102. The time period controller 103 is a circuit which controls the application time of a measuring voltage which is applied between predetermined electrodes of a semiconductor device. As other structures of the present embodiment are similar to those described in the first embodiment, detailed description thereof will be omitted.

Figure 13:
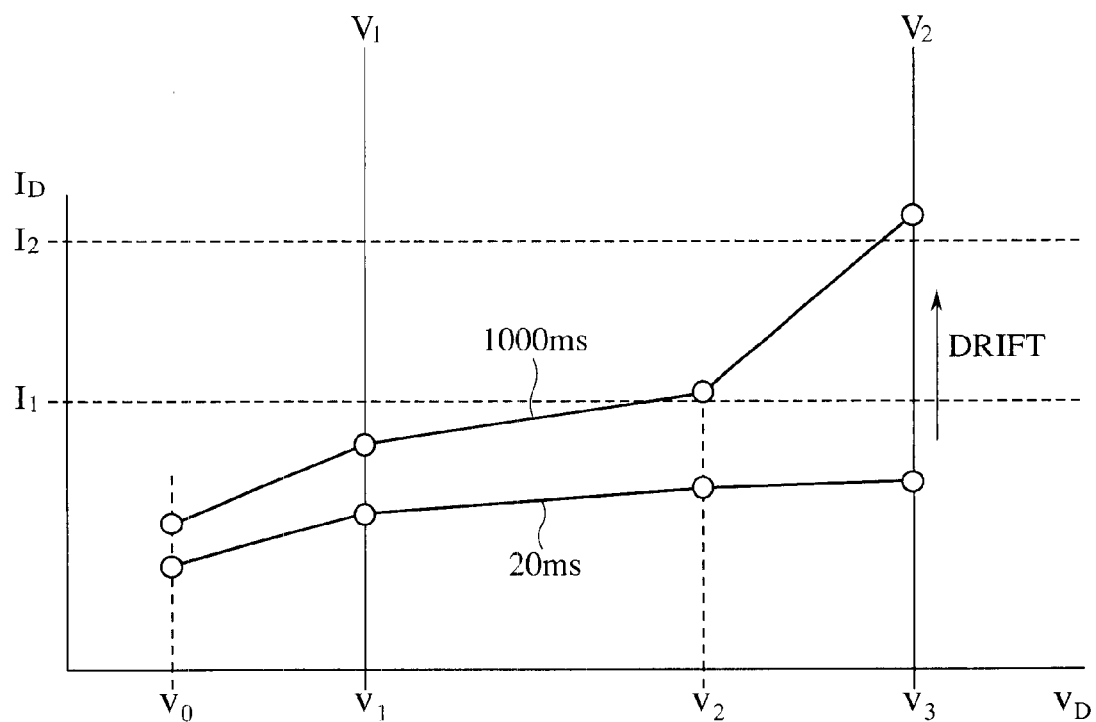
FIG. 13 is a view showing an example of output obtained with different time periods of the measuring voltage.

In a method for automatically classifying semiconductor devices according to the second embodiment of the present invention, using the time period controller 103 of the current measuring unit 12 shown in FIG. 11, the drain current is measured by changing, for example, the time period of the measuring voltage applied between source and drain electrodes of FET. For example, as shown in FIG. 12, current values at the time period t1 (e.g. 20 ms) and current values at the time period t2 (e.g. 1000 ms) are measured for each measuring voltage . Then, similarly to the first embodiment, a shape pattern of the curve showing the I-V characteristics of the semiconductor device is obtained for each time period. The measured results are output on the display of the output unit 7 shown in FIG. 11. The examples of the measured results are shown in FIG. 13.

The phenomenon in which the drain current changes in accordance with the change in the application time of the measuring voltage applied between source and drain electrodes of a semiconductor device (FET) is known as "walk out" or "drift". Such "walk out" or "drift" sometimes brings failures into the semiconductor device. However, since "walk out" or "drift" significantly varies depending on the periods during which the measuring voltages are applied and each operator tends to employ different time periods, the obtained measured results are not based on the same conditions and thus accurate determination thereof is quite difficult. By using the automatic semiconductor device classification system according to the second embodiment of the present invention, the measured results of the drift characteristics under the same conditions can be easily obtained, in addition to the effectiveness described in the first embodiment, allowing more accurate analysis of the drift characteristics of the I-V characteristics.

Figure 14:
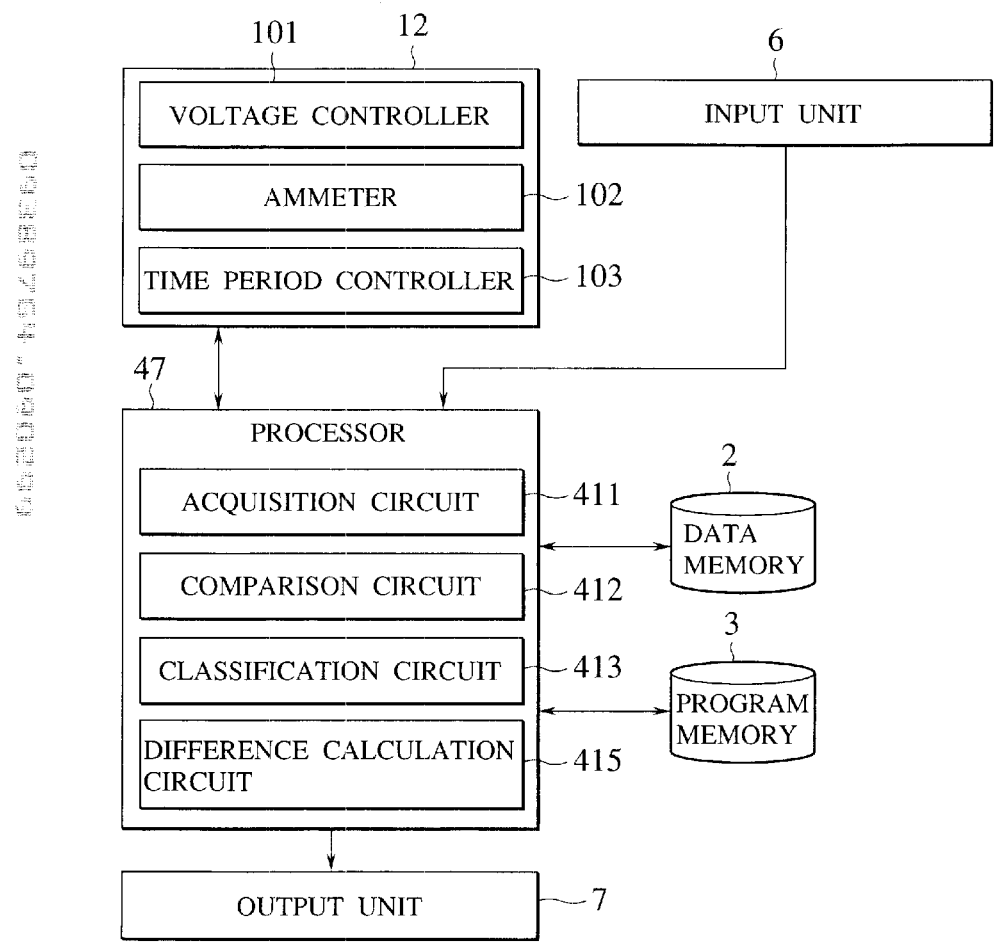
FIG. 14 is a schematic block diagram showing a structure of an automatic semiconductor device classification system according to a modified example of the second embodiment of the present invention.

FIG. 14 is a schematic block diagram showing a structure of the automatic semiconductor device classification system according to a modified example of the second embodiment of the present invention. Different from the structure shown in FIG. 13, the processor 47 further includes a difference calculation circuit 415. The difference calculation circuit 415 is a circuit which obtains a difference between one set of approximate I-V characteristics and another set of approximate I-V characteristics, each set of approximate I-V characteristics being determined in accordance with the corresponding time period (a plurality of sets of approximate I-V characteristics are determined associated with a plurality of each different time period). The difference calculation circuit 415 may have the dedicated hardware, or may comprises a general purpose computer system in which the above function is defined by the instruction given by software program. Since other structures of the present embodiment are similar to those in FIG. 3, detailed description thereof will be omitted.

According to the automatic semiconductor device classification system of the modified example of the second embodiment, as shown in FIG. 14, the difference in the approximate I-V characteristics between two different time periods can be obtained and the amount of such difference can be displayed for each exposure area (chip area) on the surface of the semiconductor wafer. In other words, by producing a wafer-map showing the amount of difference in the drift characteristics, the distribution of the magnitude of drift can be visualized on the surface of the semiconductor wafer and thus the tendency of the drift characteristics can be easily grasped. Accordingly, the cause of failures in the semiconductor device can be more accurately and more concretely specified, allowing more quick analysis and more quick action in case any failure or trouble occur.

Third Embodiment

Figure 15:
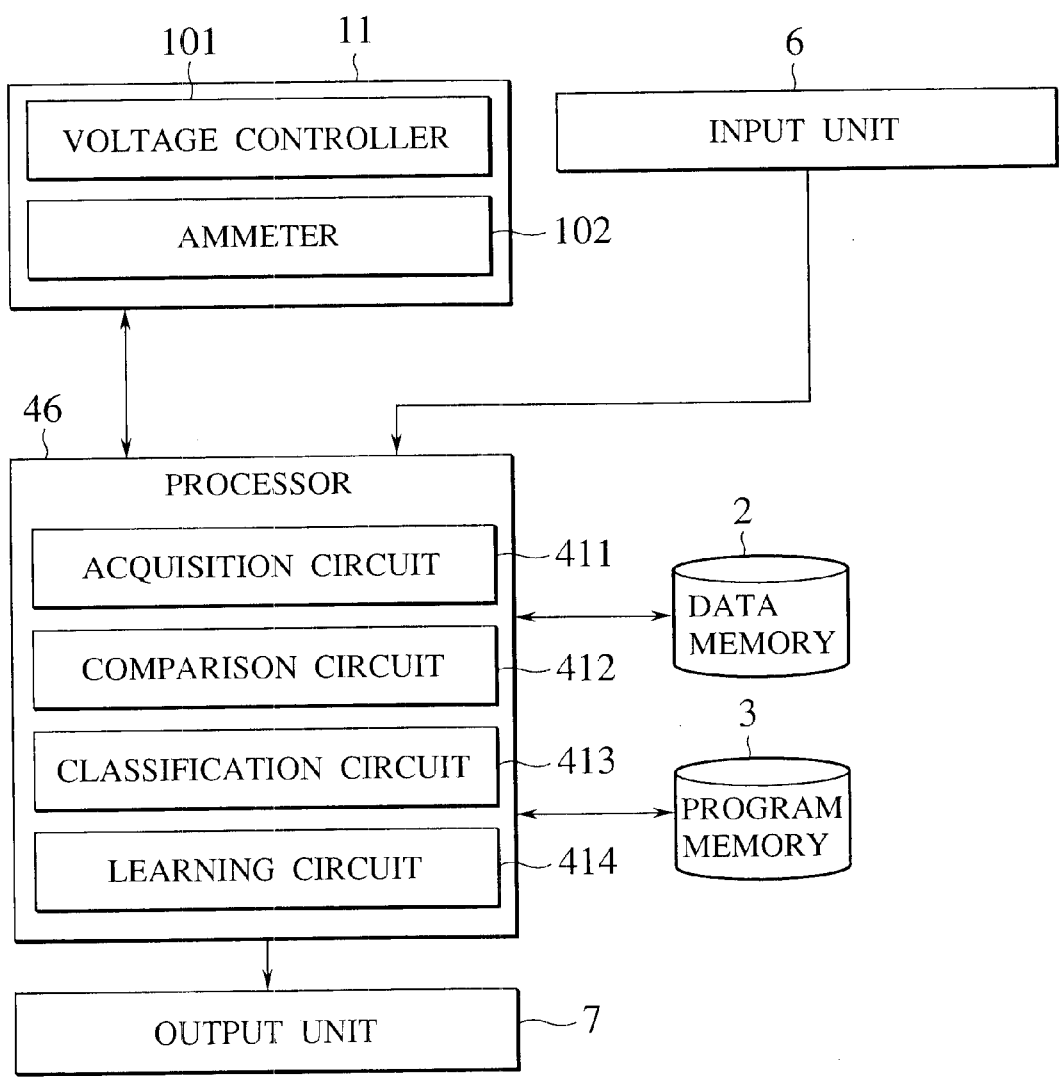
FIG. 15 is a schematic block diagram showing a structure of an automatic semiconductor device classification system according to a third embodiment of the present invention.

An automatic semiconductor device classification system according to a third embodiment of the present invention is, as shown in FIG. 15, different from the automatic semiconductor device classification system of the first embodiment, is that the processor 46 further includes a learning circuit 414. The learning circuit 414 is a circuit which obtains a classification pattern by using the measured approximate I-V characteristics of the semiconductor device as a "model" data. The learning circuit 414 may have the dedicated hardware, or may comprises a general purpose computer system in which the above function is defined by the instruction given by software program. As other structures of the present embodiment are similar to those in FIG. 1, detailed description thereof will be omitted.

Figure 16:
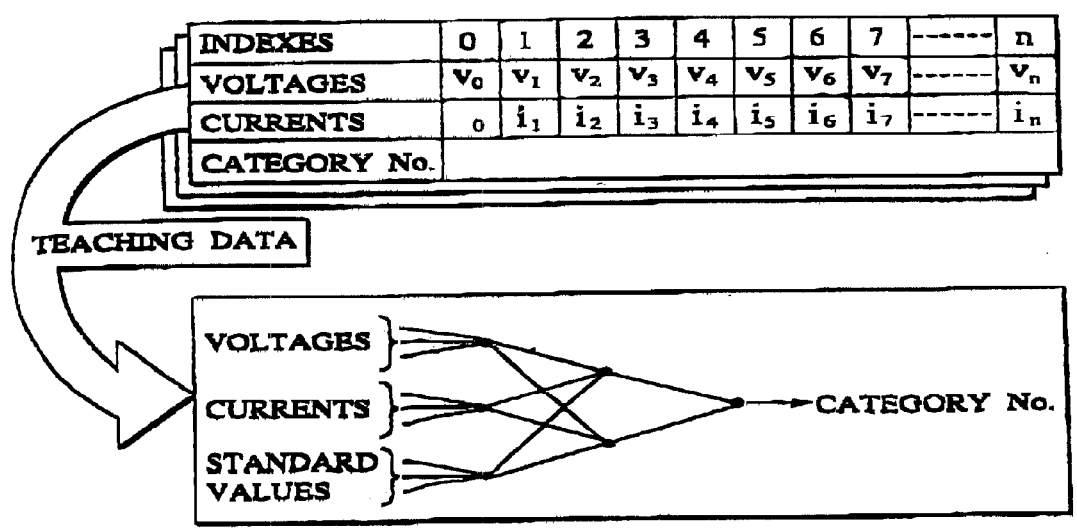
FIG. 16 is a view showing a structure of a neural network mechanism.

In the automatic semiconductor device classification system according to the third embodiment of the present invention, a shape pattern of the curve showing the I-V characteristics of a semiconductor (FET) is obtained in a manner similar to that described in the first embodiment. The obtained shape pattern of the curve showing the I-V characteristics is expressed with its category No. The category No. and the standardized measuring voltage values, the standardized measured current values, the control voltage ($V_1$, $V_2$), the threshold current values ($I_1$, $I_2$) are regarded as model data as shown in FIG. 16. The model data is input into a neural network mechanism which is established according to the neuro-model having a learning function based on, for example, the back propagation method as shown in FIG. 16, and the shape pattern of the curve showing the I-V characteristics of the semiconductor device (FET) is obtained by the neural network mechanism. A fuzzy mechanism may also be added into this neural network mechanism.

Figure 17:
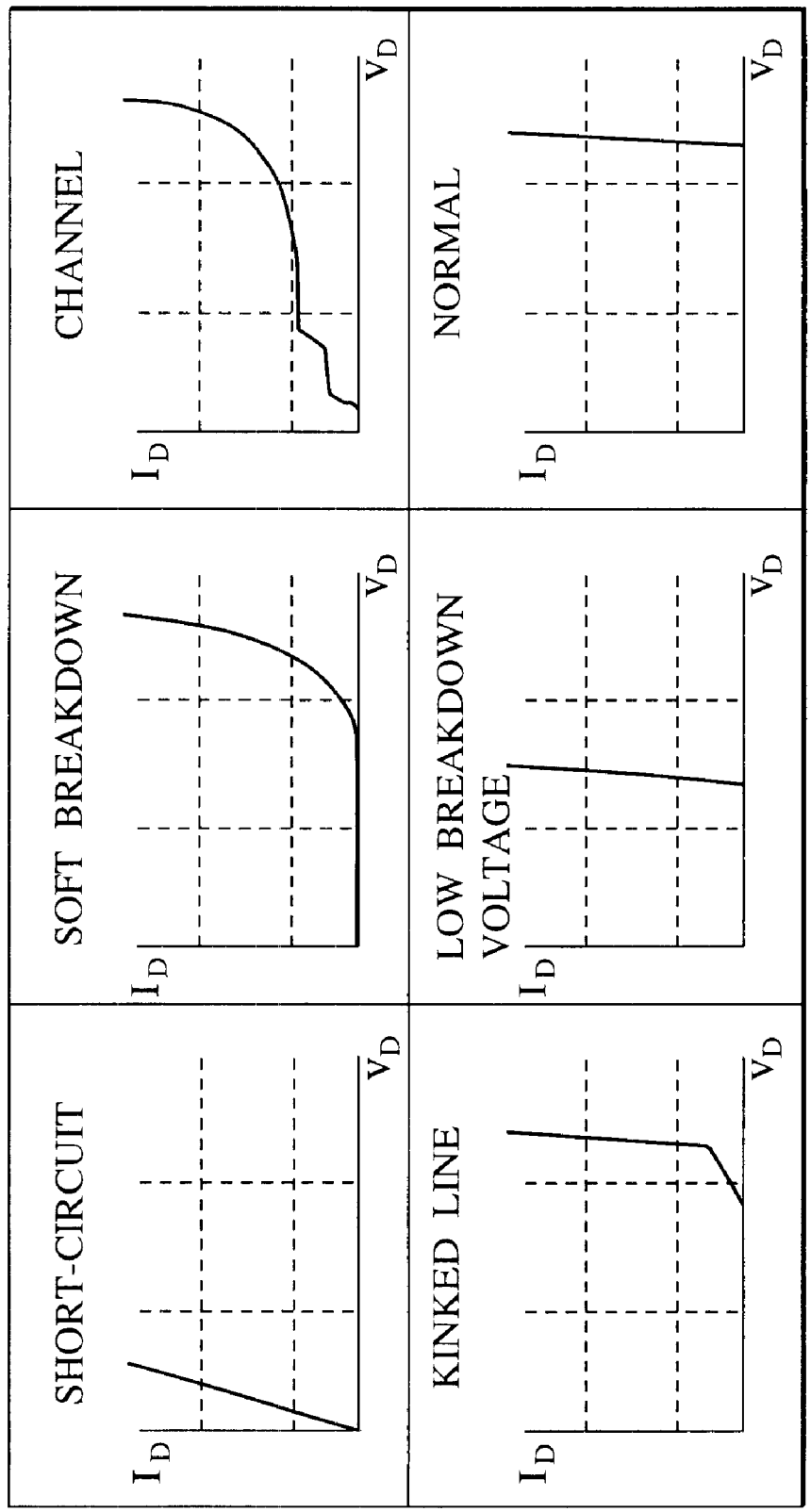
FIG. 17 is a view showing an example of categories of the approximate I-V characteristics.

In the automatic semiconductor device classification system according to the third embodiment of the present invention, in addition to the effectiveness similar to those described in the first embodiment, another effectiveness of automatically obtaining more accurate and more specified category of the approximate I-V characteristics like "soft breakdown", "hard break down", "channel", "kinked line" can be achieved as shown in FIG. 17.

Therefore, the I-V characteristics of semiconductor devices can be automatically determined and classified in a short time according to the category obtained by the learning circuit 414.

Other Embodiments

Various modification will become possible for those skilled in the art after receiving teachings of the present disclosure without departing from the scope of thereof.

In the first, second and third embodiments of the present invention described above, the I-V characteristics representing the breakdown voltage between source and drain electrodes of FET are described as examples. The I-V relation between predetermined electrodes of the semiconductor device are equivalent with the I-V relation between two electrodes of a diode having a npn, npin, pnp, pnip structure. Accordingly, as SIT has a similar npn, npin, pnp, pnip structure between source and drain, SIT can also be automatically determined and classified likewise. In addition, as BJT has a similar npn, npin, pnp, pnip structure between emitter and collector, BJT can also be automatically determined and classified likewise.

In more general cases, the reverse I-V characteristics of a pn junction diode, a pin junction diode or a Schottky gate diode can be measured and automatically classified into a predetermined category. Specifically, it is possible to automatically classify the I-V characteristic-curves representing the reverse breakdown voltage of such more common diodes into categories like the soft breakdown characteristic, the hard breakdown characteristic etc. Accordingly, the curves representing the reverse I-V characteristics between anode and cathode of various diodes including LED and LD can be automatically classified. Further, as the structure between collector and base (or emitter and base) of BJT is a diode, and as the structure between gate and drain (or source and gate) of junction FET or junction SIT is a diode, the curves representing the reverse I-V characteristics in such cases can also be automatically classified. As the structure between anode and cathode of SI thyristor is a pin junction diode structure, the curves representing the I-V characteristics and the reverse blocking characteristics of the SI thyristor can be classified. Further, in a diode of MOS structure, it is possible to perform a breakdown voltage test in a range of voltage at or under the rating breakdown voltage. Accordingly, the curves representing the reverse I-V characteristics between gate and drain electrodes (or source and gate electrodes) of insulated gate FET (or insulated gate SIT) or between gate and collector electrodes (or gate and emitter electrodes) of IGBT can be automatically classified. Yet further, the I-V characteristics curves representing the reverse blocking characteristics between anode and cathode electrodes of a thyristor or GTO thyristor having a pnpn structure or a npnp structure, can also be classified. Similarly, the I-V characteristics curves representing the reverse blocking characteristics between emitter and collector electrodes of IGBT, having similar npnp, npinp, pnpn, pnipn structure can also be automatically determined and classified likewise.

The scope of the present invention does not need to be limited to the I-V characteristics of the breakdown voltage characteristics, the reverse blocking characteristics, or the reverse I-V characteristics of the diodes. For example, the forward I-V characteristics of the diode or the like can be automatically classified into predetermined categories such as "open circuit failure", "large ON resistance (abnormal)", "small ON resistance (normal), "short circuit failure", "poor ohmic contact" and the like.

Figure 18:
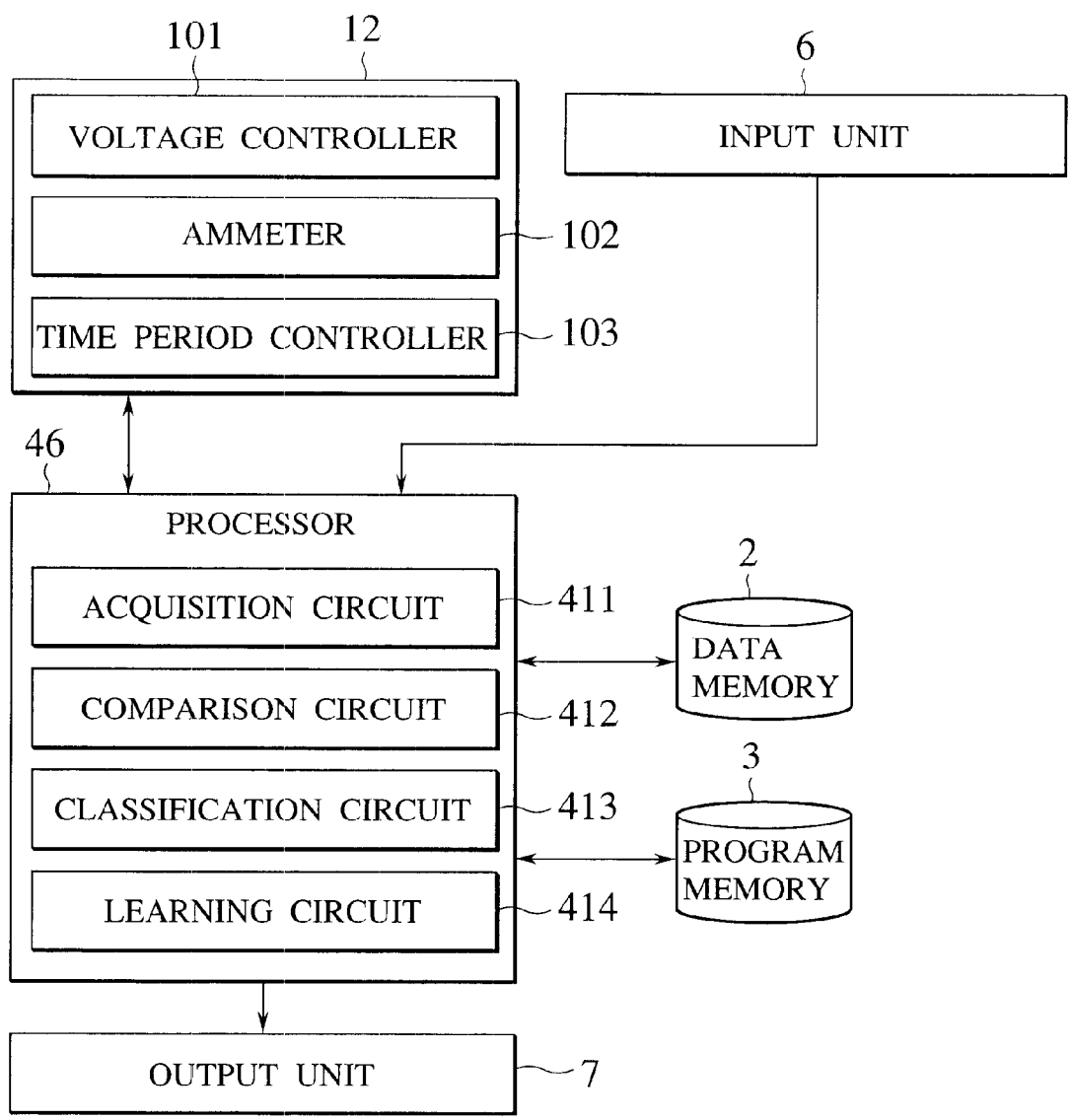
FIG. 18 is a schematic block diagram showing a structure of an automatic semiconductor device classification system according to yet another embodiment of the present invention.

A system organization in which the automatic semiconductor device classification system of the second embodiment and that of the third embodiment are combined is also possible. FIG. 18 shows a system organization in which the current measuring unit 12 further has the time period controller 103 shown in FIG. 11 and the processor 46 further has the learning circuit 414 shown in FIG. 15. According to the structure shown in FIG. 18, the learning function of automatically achieving more accurate and specified categories of the I-V characteristics, and the effectiveness of accurately analyzing the drift characteristics for the I-V characteristics, can be both resulted. Further, the drift characteristics may also be learnt such that predetermined categories including the drift characteristics can be automatically obtained.

On the other hand, FIG. 19 shows a system organization in which the processor 48 is constructed by adding both the learning circuit 414 and the difference calculation circuit 415. And the current measuring unit 12 further has the time period controller 103. According to the structure shown in FIG. 19, the distribution of the magnitude of the drift in the I-V characteristics can be visualized on the surface of the semiconductor wafer by producing the wafer-map on the basis of the amount of difference for each semiconductor device disposed on the respective chip areas. As a result, the tendency of the drift characteristics can now be easily grasped and thus a learning function of automatically achieving more accurate and more specified categories of the I-V characteristics and the drift characteristics is provided.

In the end of description of the first embodiment, it is mentioned that the program for automatically classifying semiconductor devices shown in FIG. 2 and FIG. 6 may be stored in the recording medium readable by a computer. Similarly, the program for automatically classifying semiconductor devices which is required for executing the second and the third embodiment may be stored in a recording medium which is readable by the computer. The program stored in the recording medium in such a manner may be read out by the computer system as shown in FIGS. 11, 14, 15, 18 and 19 and stored in the program memory 3, such that the program is executed in the processor 45 and the approximate I-V characteristics between predetermined electrodes of the semiconductor device are automatically classified.

It should be noted that the present invention may include various embodiments and the like which are not described in the present specification. Accordingly, the technical scope of the present invention is to be defined by the appended claims alone which are understood from the aforementioned description.

What is claimed is:

1. An automatic semiconductor device classification system comprising:
   (a) a current measuring unit having:
      a voltage controller configured to apply a sequence of discrete output voltages between predetermined electrodes disposed on each of semiconductor devices, he discrete output voltages are gradually increasing discrete voltages, each oft the discrete output voltages is constant with regard to time the semiconductor devices are disposed in respective chip areas arranged on a surface of a semiconductor wafer; and
      an ammeter configured to measure corresponding discrete currents flowing between he predetermined electrodes;
   (b) a data memory for storing measured discrete I-V relations defined by the measured discrete current and the applied discrete output voltages, a first control voltage assigned between the predetermined electrodes, a first threshold current value assigned between the predetermined electrodes at the first control voltage, a second control voltage assigned between the predetermined electrodes which is larger than the first control voltage, and a second threshold current value assigned between the predetermined electrodes at the second control voltage, the second threshold current value is larger than the first threshold current value; and
   (c) the processor connected to the data memory and the current measuring unit, the processor comprising:
      an acquisition circuit for obtaining a first decision current value flowing between the predetermined electrodes at the first control voltage and a second decision current value flowing between the predetermined electrodes at the second control voltage using the discrete I-V relations;
      a comparison circuit connected to the acquisition circuit for comparing the first decision current value with the first threshold current value stored in the data memory and comparing the second decision current value with the second threshold current value stored in the data memory; and
      a classification circuit connected to the comparison circuit for determining an approximate I-V characteristic between the predetermined electrodes on the basis of results obtained by the comparison circuit and then performing classification according to the determination.

2. The system of claim 1, further comprising:
   (d) an output unit connected to the processor for outputting classified results.

3. The system of claim 2, wherein the current measuring unit measures plural sets of the discrete I-V relations between electrodes of each of a plurality of semiconductor devices, and the output unit outputs a classification map on the surface of the semiconductor wafer of the approximate I-V characteristics.

4. The system of claim 1, wherein the data memory is installed in or connected to a host computer.

5. The system of claim 4, wherein the processor is installed in a terminal computer connected to the host computer.

6. The system of claim 4, wherein the processor is installed in a plurality of terminal computers, connected to the host computer, respectively.

7. The system of claim 1, wherein the current measuring unit further comprises a time period controller for controlling time period of the discrete output voltage.

8. The system of claim 7, wherein the current measuring unit applies two sets of the discrete output voltages with different time periods, and the classification circuit determines approximate I-V characteristics between the predetermined electrodes for each time period and classifies the determined approximate I-V characteristics into predetermined categories.

9. The system of claim 7, further comprises:
   (d) an output unit for outputting classified results.

10. The system of claim 9, wherein the current measuring unit applies two sets of the discrete output voltages with different time periods, the classification circuit determines approximate I-V characteristics between the predetermined electrodes for each time period and classifies the determined approximate I-V characteristics into predetermined categories, and the output unit displays the approximate I-V characteristics for each different time period in an overlapped but distinguishable manner.

11. The system of claim 9, wherein the processor further comprises:
   a difference calculation circuit for obtaining a difference of the approximate I-V characteristics between one and another time periods.

12. The system of claim 9, wherein the current measuring unit applies two sets of the discrete output voltages with different time periods, the classification circuit determines an approximate I-V characteristic between the predetermined electrodes for each time period and the output unit displays a difference of the approximate I-V characteristics between one and another time periods.

13. The system of claim 12, wherein the current measuring unit measures plural sets of the I-V relations for each of a plurality of semiconductor devices, and the output unit outputs a distribution of the differences on the surface of the semiconductor wafer.

14. The system of claim 1, wherein the processor further comprises:
a learning circuit connected to the data memory and the classification circuit, for obtaining a new category by using the approximate I-V characteristics as model data.

15. The system of claim 14, wherein the learning circuit has a neural network mechanism in which the new category is obtained using a learning function by a neuro-model.

16. The system of claim 1, wherein each of the semiconductor devices is a transistor whose gate electrode is set open, and said ammeter measures the current flowing between source and drain electrodes of the transistor.

17. The system of claim 1, wherein said classification circuit classifies the I-V relations into one of "channel", "soft break down", "short circuit failure" and "hard break down", respectively.

18. A method for automatically classifying a plurality of semiconductor devices, the semiconductor devices are disposed in respective chip areas arranged on a surface of a semiconductor wafer, comprising the steps of:
(a) setting a first control voltage assigned between predetermined electrodes disposed on each of semiconductor devices, a first threshold current value assigned between the predetermined electrodes at the first control voltage, a second control voltage assigned between the predetermined electrodes which is larger than the first control voltage, and a second threshold current value assigned between the predetermined electrodes at the second control voltage, the second threshold current value is larger than the first threshold current value;
(b) applying a set of discrete measuring voltages between the predetermined electrodes, the discrete measuring voltages are gradually increasing discrete voltages, each of the discrete measuring voltages is constant with regard to time, and measuring discrete current values flowing between the predetermined electrodes during application of each of the discrete measuring voltages;
(c) obtaining a first decision current value flowing between the predetermined electrodes at the first control voltage and a second decision current value flowing between the predetermined electrodes at the second control voltage, on the basis of the discrete current values;
(d) comparing the first decision current value with the first threshold current value and comparing the second decision current value with the second threshold current value; and
(e) determining an approximate I-V characteristic between the predetermined electrodes on the basis of the results obtained in step (d) and classifying the approximate I-V characteristic into predetermined category.

19. The method of claim 18, further comprises:
a step of outputting the classified results.

20. The method of claim 18, wherein the measuring step (b) includes the steps of:
applying measuring voltages with different time periods but at the same measuring voltage value; and
measuring the current value for each different time period, and the outputting step includes a step of outputting the approximate I-V characteristic for each time period in an overlapped but distinguishable manner.

21. The method of claim 18, further comprises a step of inputting curves of the determined approximate I-V characteristics as model data and obtaining, by using a learning function, a new category of pattern used for the classifying step.

22. The method of claim 18, wherein each of the semiconductor devices is a transistor whose gate electrode is set open, and the first and second decision current values flowing between source and drain electrodes of the transistor are obtained.

23. The method of claim 18, wherein said I-V relations are classified into one of "channel", "soft break down", "short circuit failure" and "hard break down", respectively.

24. A memory medium having a computer readable program for causing a semiconductor device classification system to function, the program comprising the steps of:
(a) setting a first control voltage assigned between predetermined electrodes disposed on each of the semiconductor devices, a first threshold current value assigned between the predetermined electrodes at the first control voltage, a second control voltage assigned between the predetermined electrodes which is larger than the first the first control voltage, and a second threshold current value assigned between the predetermined electrodes at the second control voltage, the second threshold current value larger than the first threshold current value, the semiconductor devices are disposed in respective chip areas arranged on a surface of a semiconductor wafer;
(b) applying a set of discrete measuring voltages between the predetermined electrodes, the discrete measuring voltages are gradually increasing discrete voltages, each of the discrete measuring voltages is constant with regard to time, and measuring discrete current values flowing between the predetermined electrodes during application of each of the discrete measuring voltages;
(c) obtaining a first decision current value flowing between the predetermined electrodes at the first control voltage and a second decision current value flowing between the predetermined electrodes a the second control voltage, on the basis of the discrete current values;
(d) comparing the first decision current value with the first threshold current value and comparing the second decision current value with the second threshold current value; and
(e) determining an approximate I-V characteristic between the predetermined electrodes of the semiconductor on the basis of the results obtained in step (d) and classifying the approximate I-V characteristic into predetermined category.

25. The memory medium of claim 24, wherein each of the semiconductor devices is a transistor whose gate electrode is set open, and the first and second decision current values flowing between source and drain electrodes of the transistor are obtained.

26. The memory medium of claim 24, wherein said I-V relations are classified into one of "channel", "soft break down", "short circuit failure" and "hard break down", respectively.

* * * * *